United States Patent
Takamine et al.

(10) Patent No.: US 6,828,878 B2
(45) Date of Patent: Dec. 7, 2004

(54) SURFACE ACOUSTIC WAVE DEVICE AND COMMUNICATION APPARATUS UTILIZING A RESONATOR WITH A DUMMY ELECTRODE

(75) Inventors: Yuichi Takamine, Kanazawa (JP); Yoichi Sawada, Ishikawa-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/367,257

(22) Filed: Feb. 14, 2003

(65) Prior Publication Data

US 2003/0155993 A1 Aug. 21, 2003

(30) Foreign Application Priority Data

Feb. 15, 2002 (JP) .......................................... 2002-037974
Nov. 15, 2002 (JP) .......................................... 2002-331835

(51) Int. Cl.[7] .............................. H03H 9/64; H03H 9/72
(52) U.S. Cl. ........................ 333/193; 333/133; 333/195; 310/313 B
(58) Field of Search ................................. 333/193–196, 333/133; 310/313 B, 313 D

(56) References Cited

U.S. PATENT DOCUMENTS

| 4,346,322 A |  | 8/1982 | Sato et al. ............... 310/313 B |
|---|---|---|---|
| 5,568,002 A | * | 10/1996 | Kawakatsu et al. ...... 310/313 B |
| 5,694,096 A | * | 12/1997 | Ushiroku et al. ........... 333/195 |
| 6,025,763 A | * | 2/2000 | Morimoto .................... 333/195 |
| 6,462,632 B1 | * | 10/2002 | Fujii et al. ................... 333/193 |
| 6,501,208 B1 | * | 12/2002 | Kuroda .................... 310/131 R |
| 6,556,100 B2 | * | 4/2003 | Takamine ................... 333/133 |

FOREIGN PATENT DOCUMENTS

| EP | 0 998 039 A1 | 5/2000 |
|---|---|---|
| EP | 1 005 153 A2 | 5/2000 |
| JP | 07-030367 | 1/1995 |
| JP | 2000-315931 | * 11/2000 |

\* cited by examiner

*Primary Examiner*—Barbara Summons
(74) *Attorney, Agent, or Firm*—Keating & Bennett, LLP

(57) ABSTRACT

A surface acoustic wave (SAW) device includes at least one longitudinally coupled resonator SAW filter and at least one SAW resonator connected in series to the SAW filter on a piezoelectric substrate. The SAW resonator is arranged such that the resonant frequency is located within the pass band of the SAW filter and the antiresonant frequency is located outside the pass band of the SAW filter. A dummy electrode is provided between an electrode finger and a bus bar of an interdigital transducer (IDT) of the SAW resonator. The gap between the dummy electrode and the electrode finger of the IDT is about $0.5\lambda$ or less when the wavelength determined by the pitch between the electrode fingers of the interdigital transducers of the SAW resonator is indicated by $\lambda$.

15 Claims, 40 Drawing Sheets

SURFACE ACOUSTIC WAVE DEVICE AND COMMUNICATION APPARATUS UTILIZING A RESONATOR WITH A DUMMY ELECTRODE

BACKGROUND OF THE INVENTION

1. Field of the Invention

The present invention relates to a wide-band, high-yield surface acoustic wave (SAW) device including a SAW resonator connected in series to a SAW filter. The present invention also relates to a communication apparatus including such a SAW device.

2. Description of the Related Art

In communication systems for use in communication apparatuses, such as cellular telephones, the frequency band is increasing due to an increase in the number of subscribers and the diversity of services. Accordingly, there is a growing demand to increase the pass band of SAW devices provided with a SAW filter, which are widely used as RF bandpass filters in communication apparatuses, such as cellular telephones.

The number of systems having a transmission frequency band and a reception frequency band that are similar is increasing. In a transmission bandpass filter, the attenuation of the reception frequency band must be increased, and in a reception bandpass filter, the attenuation of the transmission frequency band must be increased. Accordingly, there is also a demand to increase the attenuation in a frequency band very close to the pass band.

A known configuration and a method for increasing the attenuation at the high-frequency side very close to the pass band is disclosed in Japanese Unexamined Patent Application Publication No. 7-30367, and provides a SAW device including a SAW resonator that is connected in series to a SAW filter.

In the SAW device disclosed in the above-described publication, as shown in FIG. 38, a SAW resonator 102 is connected in series to a 3-IDT longitudinally coupled resonator SAW filter 101. An IDT is a comb-like electrode portion (also referred to as an "interdigital transducer").

The frequency of the longitudinally coupled resonator SAW filter 101 and the frequency of the SAW resonator 102 are set such that the antiresonant frequency of the SAW resonator 102 is greater than a pass band of the longitudinally coupled resonator SAW filter 101 and the resonant frequency of the SAW resonator 102 is within the pass band of the SAW filter 101.

With this configuration, since the antiresonant frequency of the SAW resonator 102 is greater than the pass band of the longitudinally coupled resonator SAW filter 101, the attenuation at the high-frequency side close to the pass band is increased. Also, since the resonant frequency of the SAW resonator 102 is within the pass band, a large insertion loss within the pass band is prevented.

In the frequency band between the resonant frequency and the antiresonant frequency of the SAW resonator 102, the impedance is inductive. Thus, by matching this frequency band to a frequency band in which the impedance is capacitive within the pass band of the longitudinally coupled resonator SAW filter 101, the voltage standing wave ratio (VSWR) within the pass band is advantageously decreased.

In the configuration of the known SAW device shown in FIG. 38, however, there is a dip toward the high-frequency side in the pass band, and thus, the pass bandwidth is disadvantageously reduced. The inventors of this application have discovered that the reason for this is due to the generation of a spurious response caused by a surface skimming bulk wave (SSBW) in the frequency band between the resonant frequency and the antiresonant frequency of the SAW resonator 102, which often occurs when a 40±5° Y-cut X-propagating $LiTaO_3$ substrate is used.

A typical impedance characteristic of the SAW resonator 102 is shown in FIG. 39, and a phase characteristic thereof is shown in FIG. 40. In FIGS. 39 and 40, the distortions indicated by A are spurious responses caused by a SSBW (the distortion in FIG. 40 is more noticeable). The generation of a dip toward the high-frequency side in the pass band caused by a spurious response narrows the pass bandwidth, thereby considerably increasing the insertion loss in the pass band due to a temperature change or decreasing the yield due to manufacturing variations.

SUMMARY OF THE INVENTION

To overcome the problems described above, preferred embodiments of the present invention provide a SAW device having a wide band while maintaining a large attenuation outside the pass band by shifting a spurious response to a frequency band in which the influence of a dip is negligible.

A SAW device according to a preferred embodiment of the present invention includes a SAW filter provided on a piezoelectric substrate and including at least two IDTs arranged along a direction in which a SAW propagates, and a SAW resonator provided on the piezoelectric substrate and connected in series to the SAW filter. In the SAW resonator, a SSBW is shifted toward a resonant frequency side.

With this configuration, a large insertion loss in the pass band is prevented, and the attenuation outside the pass band very close to the high-frequency side of the pass band is increased. Since the SAW resonator is arranged such that a spurious response caused by a SSBW is shifted to the resonant frequency, a dip occurring at the high-frequency side in the pass band is reduced, thereby increasing the pass band.

A SAW device according to another preferred embodiment of the present invention includes at least one SAW filter provided on a piezoelectric substrate and including at least two IDTs arranged along a direction in which a SAW propagates, and at least one SAW resonator provided on the piezoelectric substrate and connected in series to the SAW filter. The SAW resonator is arranged such that the resonant frequency thereof is located within the pass band of the SAW filter and that the antiresonant frequency thereof is located outside the pass band, and a dummy electrode is provided between an electrode finger and a bus bar of each of the IDTs of the SAW resonator such that a spurious response caused by a SSBW is located within the pass band.

With this configuration, a large insertion loss in the pass band is prevented, and the attenuation outside the pass band very close to the high-frequency side in the pass band is increased. In the SAW resonator, a dummy electrode is provided between an electrode finger and a bus bar of each IDT such that a spurious response caused by a SSBW is located within the pass band. Accordingly, a dip occurring at the high-frequency side in the pass band is reduced, thereby increasing the pass band. The VSWR of the SAW device is also reduced.

In the aforementioned SAW device, a gap between the dummy electrode and the electrode finger of the IDTs of the SAW resonator is preferably about 0.5λ or less, where the wavelength determined by the pitch between the electrode fingers of the IDTs is indicated by λ. With this arrangement, a dip occurring at the high-frequency side in the pass band is reduced, thereby increasing the pass band.

In the aforementioned SAW device, the length of the dummy electrode of the SAW resonator is preferably at least about 0.25λ, where the wavelength determined by the pitch between the electrode fingers of the IDTs of the SAW resonator is indicated by λ. With this arrangement, a spurious response caused by a SSBW gradually approaches the resonant frequency, namely, the amount by which the frequency of a spurious response is shifted is small. Thus, the characteristics of the SAW device are stabilized even if the lengths of the dummy electrodes vary.

In the aforementioned SAW device, the interdigital length of the IDTs of the SAW resonator is preferably about 45λ or less, where the wavelength determined by the pitch between the electrode fingers of the IDTs of the SAW resonator is indicated by λ. With this arrangement, the frequency of a spurious response is adjusted by the dummy electrodes. A dip occurring at the high-frequency side in the pass band caused by the spurious response is reliably reduced, thereby stably increasing the pass band.

In the aforementioned SAW device, the SAW filter is preferably a longitudinally coupled resonator SAW filter. The SAW device is preferably provided with a balanced-to-unbalanced conversion function.

A communication apparatus according to another preferred embodiment of the present invention includes any one of the above-described SAW devices according to other preferred embodiments of the present invention.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of a SAW device of the present invention are described below with reference to FIGS. 1 through 36. The preferred embodiments are discussed in the context of a SAW device having a balanced-to-unbalanced conversion function for DCS reception in which the impedance of the unbalanced side is, for example, about 50 Ω, and the impedance of the balanced side is, for example, about 200 Ω.

According to a preferred embodiment, a SAW device includes 3-IDT longitudinally coupled resonator SAW filters 201 and 202 and Al electrodes provided on a 40±5° Y-cut X-propagating LiTaO$_3$ substrate (not shown). That is, the SAW device of this preferred embodiment is preferably defined by the two filters 201 and 202. In this SAW device, a leaky wave is used as a SAW.

An IDT includes strip-shaped base portions (bus bars) and two electrode portions provided with a plurality of strip-shaped electrode fingers. The electrode fingers extend substantially perpendicularly from each bus bar such that they are substantially parallel to each other with uniform gaps. The electrode fingers are interdigitated with each other such that the sides thereof face each other. Accordingly, the plurality of electrode fingers are arranged in a comb-shaped configuration.

In such an IDT, the signal conversion characteristic and the pass band are determined by setting the length and the width of each electrode finger, the interval between adjacent electrode fingers, and the length by which electrode fingers face each other (hereinafter referred to as the "interdigital length").

The configuration of the longitudinally coupled resonator SAW filter 201 is as follows. An IDT 203 is provided at one side of an IDT 204, and an IDT 205 is provided at the other side of the IDT 204 such that the IDT 204 is sandwiched therebetween in a direction in which a SAW propagates. A reflector 206 is arranged next to the IDT 203, and a reflector 207 is arranged next to the IDT 205.

Figure 1:
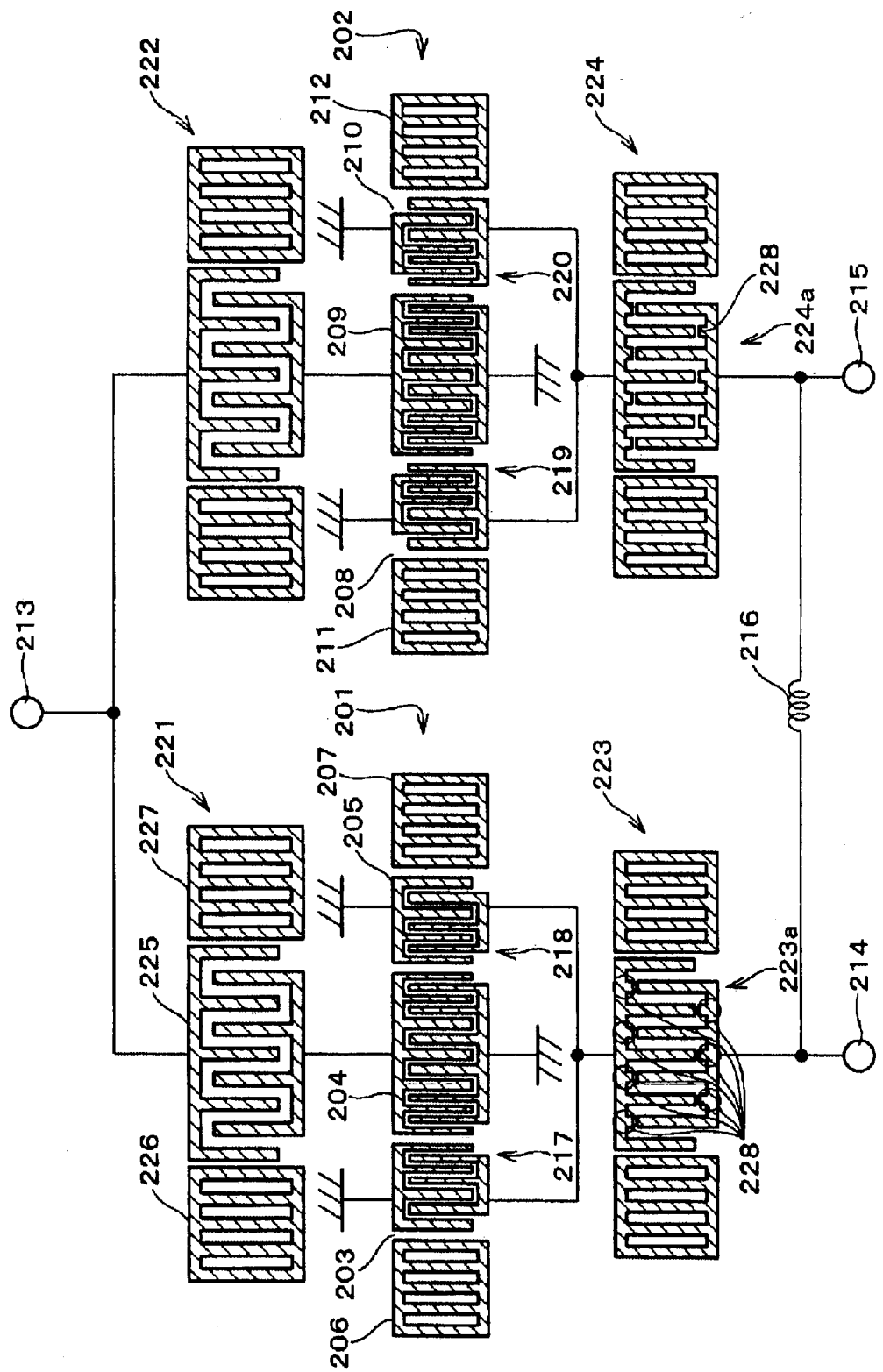
FIG. 1 is a schematic diagram illustrating a SAW device provided with dummy electrodes according to a preferred embodiment of the present invention.

FIG. 1 shows that the pitch (indicated by 217 in FIG. 1) of a few electrode fingers disposed between the IDT 203 and the IDT 204 and the pitch (indicated by 218 in FIG. 1) of a few electrode fingers between the IDT 204 and the IDT 205 are set to be less than that of the other electrode fingers. The electrode fingers having a narrow pitch are referred to as "narrow-pitch electrode fingers". Although the setting of narrow-pitch electrode fingers is irrelevant to the present invention, the insertion loss in the pass band is reduced by setting the narrow-pitch electrode fingers. In a configuration without narrow-pitch electrode fingers, advantages of the present invention are also obtained.

The configuration of the longitudinally coupled resonator SAW filter 202 is similar to that of the SAW filter 201. More specifically, an IDT 208 is provided at one side of an IDT 209, and an IDT 210 is provided at the other side of the IDT 209 such that the IDT 209 is sandwiched therebetween in a SAW propagating direction. A reflector 211 is arranged next to the IDT 208, and a reflector 212 is arranged next to the IDT 210. As in the longitudinally coupled resonator SAW filter 201, the pitch (indicated by 219 in FIG. 1) of a few electrode fingers between the IDT 208 and the IDT 209 and the pitch (indicated by 220 in FIG. 1) of a few electrode fingers between the IDT 209 and the IDT 210 are preferably less than that of the other electrode fingers.

In the longitudinally coupled resonator SAW filter 202, an output signal is out of phase with an input signal by 180° by inverting the directions of the IDTs 208 and 210 from the directions of the IDTs 203 and 205 along the interdigital length. With this arrangement, the balanced-to-unbalanced conversion function is achieved in this SAW device. Signal terminals 214 and 215 define balanced signal terminals, and a signal terminal 213 defines an unbalanced signal terminal.

An inductor 216 is inserted between the two balanced signal terminals 214 and 215. In this preferred embodiment, the value of the inductor 216 is about 22 nH. The inductor 216 provides matching between the balanced signal terminals 214 and 215, and is not a limitation to the present invention.

A SAW resonator 221 is connected in series between the longitudinally coupled resonator SAW filter 201 and the unbalanced signal terminal 213. Similarly, a SAW resonator 222 is connected in series between the longitudinally coupled resonator SAW filter 202 and the unbalanced signal terminal 213.

A SAW resonator 223 is connected in series between the longitudinally coupled resonator SAW filter 201 and the balanced signal terminal 214. Similarly, a SAW resonator 224 is connected in series between the longitudinally coupled resonator SAW filter 202 and the balanced signal terminal 215. That is, the SAW resonators 221 and 223 are connected in series to the longitudinally coupled resonator SAW filter 201, and the SAW resonators 222 and 224 are connected in series to the longitudinally coupled resonator SAW filter 202.

The configuration of the SAW resonator 221 is as follows. Reflectors 226 and 227 are arranged such that an IDT 225 is sandwiched therebetween in a SAW propagating direction. In the SAW resonators 222, 223, and 224, two reflectors are arranged such that an IDT is sandwiched therebetween. Although this preferred embodiment is described in the context of a SAW resonator having reflectors, a SAW resonator without reflectors may be provided, in which case, advantages of the present invention are also obtained.

For simple representation, only a small number of electrode fingers of the longitudinally coupled resonator SAW filters 201 and 202 and the SAW resonators 221 through 224 are shown in FIG. 1. The actual SAW filters 201 and 202 and the actual SAW resonators 221 through 224 include a greater number of electrode fingers.

In the present preferred embodiment, dummy electrodes 228 are preferably provided between the electrode fingers and the bus bars of an IDT 223a of the SAW resonator 223. Likewise, in the SAW resonator 224, the dummy electrodes 228 are preferably provided between the electrode fingers and the bus bars of an IDT 224a of the SAW resonator 224. In this case, the length of the dummy electrodes 228 is preferably about $0.25\lambda$, where the wavelength determined by the pitch of the electrode fingers of the IDT of the SAW resonators 223 and 224 is indicated by $\lambda$.

The dummy electrodes 228 having a width substantially similar to that of the electrode fingers of the IDTs 223a and 224a are arranged to extend from the bus bars facing the forward ends of the electrode fingers of the IDTs 223a and 224a to these forward ends. With this arrangement, the dummy electrodes 228 define a region in which a SAW is not generated (SAW-free region) with the corresponding adjacent electrode fingers in the SAW propagating direction, and also function as pseudo-electrodes for preventing interference with the propagation of a SAW. The length of the electrode fingers of the IDTs 223a and 224a facing the dummy electrodes 228 is reduced by the length of the dummy electrodes 228 (the length in the direction orthogonal to the SAW propagating direction).

The configuration of the longitudinally coupled resonator SAW filter 201 is described below where the wavelength determined by the pitch (indicated by 217 and 218 in FIG. 1) of the narrow-pitch electrode fingers is represented by $\lambda I2$, and the wavelength determined by the pitch of the other electrode fingers is designated by $\lambda I1$ (the numerals in parentheses represent the numbers of narrow-pitch electrode fingers):

interdigital length W: about $48.4\lambda I1$;

the number of electrode fingers of IDT 203: 22 (3);

the number of electrode fingers of IDT 204: (3)27(3);

the number of electrode fingers of IDT 205: (3)22;

IDT wavelength $\lambda I1$: 2.155 $\mu m$, $\lambda I2$: about 1.940 $\mu m$;

reflector wavelength $\lambda R$: about 2.175 $\mu m$;

the number of electrode fingers of reflectors: 150;

IDT-IDT interval: about $0.500\lambda I2$;

IDT-reflector interval: about $0.472\lambda R$ duty: about 0.63 (IDT), about 0.57 (reflector); and electrode thickness: about $0.094\lambda I1$.

The configuration of the longitudinally coupled resonator SAW filter 202 are the same as those of the longitudinally coupled resonator SAW filter 201, except that the directions of the IDTs 208 and 210 are inverted from those of the IDTs 203 and 205 of the longitudinally coupled resonator SAW filter 201, as described above.

The configuration of the longitudinally coupled resonator SAW filter 201 may be significantly different from that of the SAW filter 202 in order to increase the balancing degree between the balanced signal terminals 214 and 215 and the attenuation outside the pass band. In this case, advantages of the present invention are also achieved.

The configuration of the SAW resonators 221 and 222 is as follows:

interdigital length W: about $14.7\lambda$;

the number of electrode fingers of IDT: 241;

wavelength $\lambda$ (for both IDTs and reflectors): about 2.040 $\mu m$;

the number of electrode fingers of reflectors: 30;

IDT-reflector interval: about $0.500\lambda$ duty: about 0.60; and electrode thickness: about $0.099\lambda$.

Details of a design of the SAW resonators 223 and 224 are as follows:

interdigital length W: about $30.0\lambda$;

the number of electrode fingers of IDT: 241;

wavelength $\lambda$ (for both IDTs and reflectors): about 2.103 $\mu m$;

the number of electrode fingers of reflectors: 30;

IDT-reflector interval: about $0.500\lambda$ duty: about 0.60; and electrode thickness: about $0.096\lambda$.

The configuration of the SAW resonator 221 is the same as those of the SAW resonator 222, and also, the configuration of the SAW resonator 223 is the same as those of the SAW resonator 224. However, for the purpose of increasing the balancing degree between the balanced signal terminals 214 and 215 and the attenuation outside the pass band, the configuration may be different between the SAW resonators 221 and 222 or between the SAW resonators 223 and 224, in which case, advantages of the present invention are still obtained.

The above-described "interval" indicates the center-to-center distance between two adjacent electrode fingers. Accordingly, the "interval" hereinafter means the center-to-center distance unless otherwise stated.

The SAW resonators 223 and 224 are configured such that the resonant frequency thereof is located within the filter characteristic (pass band) of the SAW device and that the antiresonant frequency thereof is located outside the filter characteristic in the vicinity of the high-frequency side of the filter characteristic.

Figure 2:
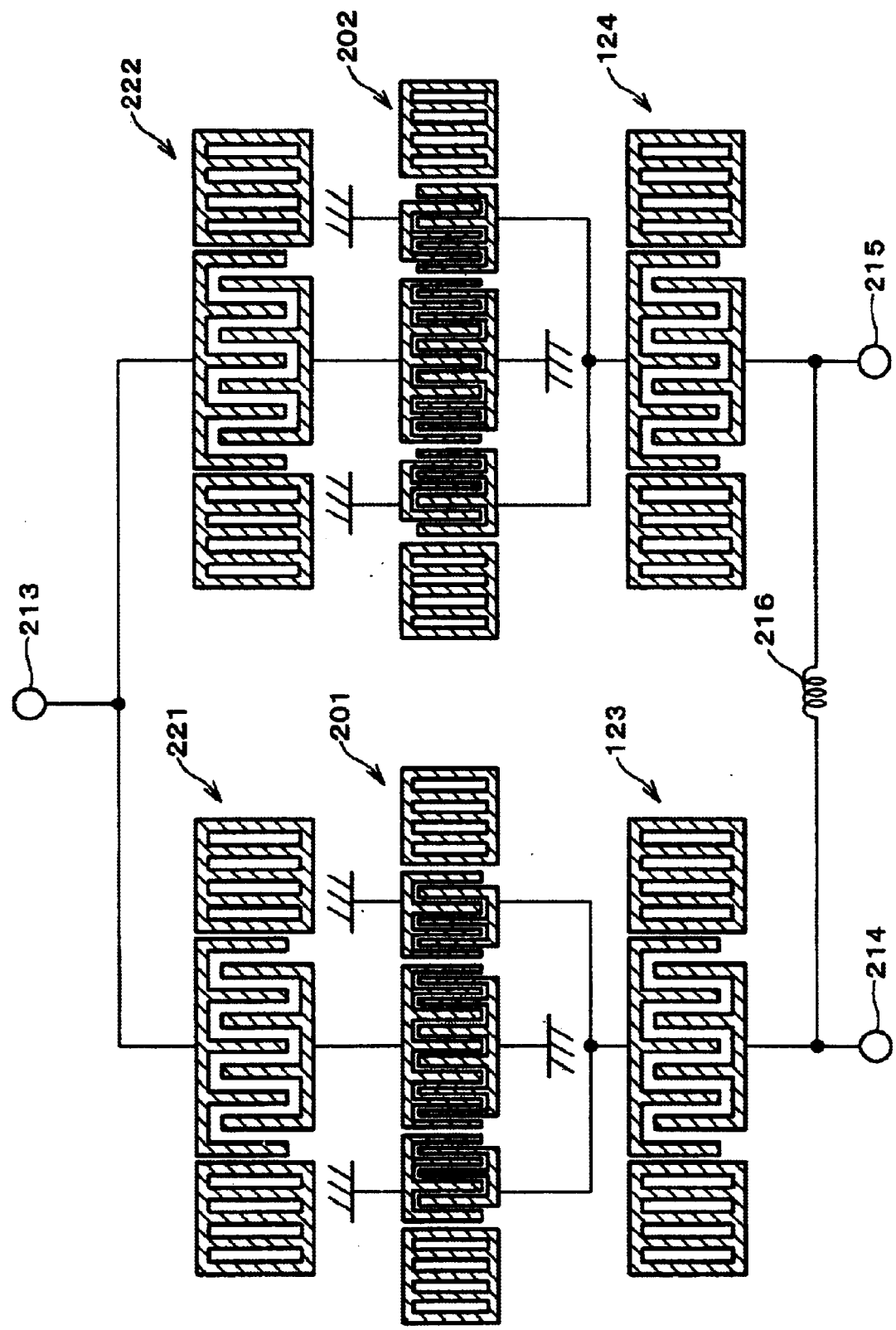
FIG. 2 is a schematic diagram illustrating a known SAW device (comparative example) without dummy electrodes for comparison with the preferred embodiment shown in FIG. 1.
Figure 3:
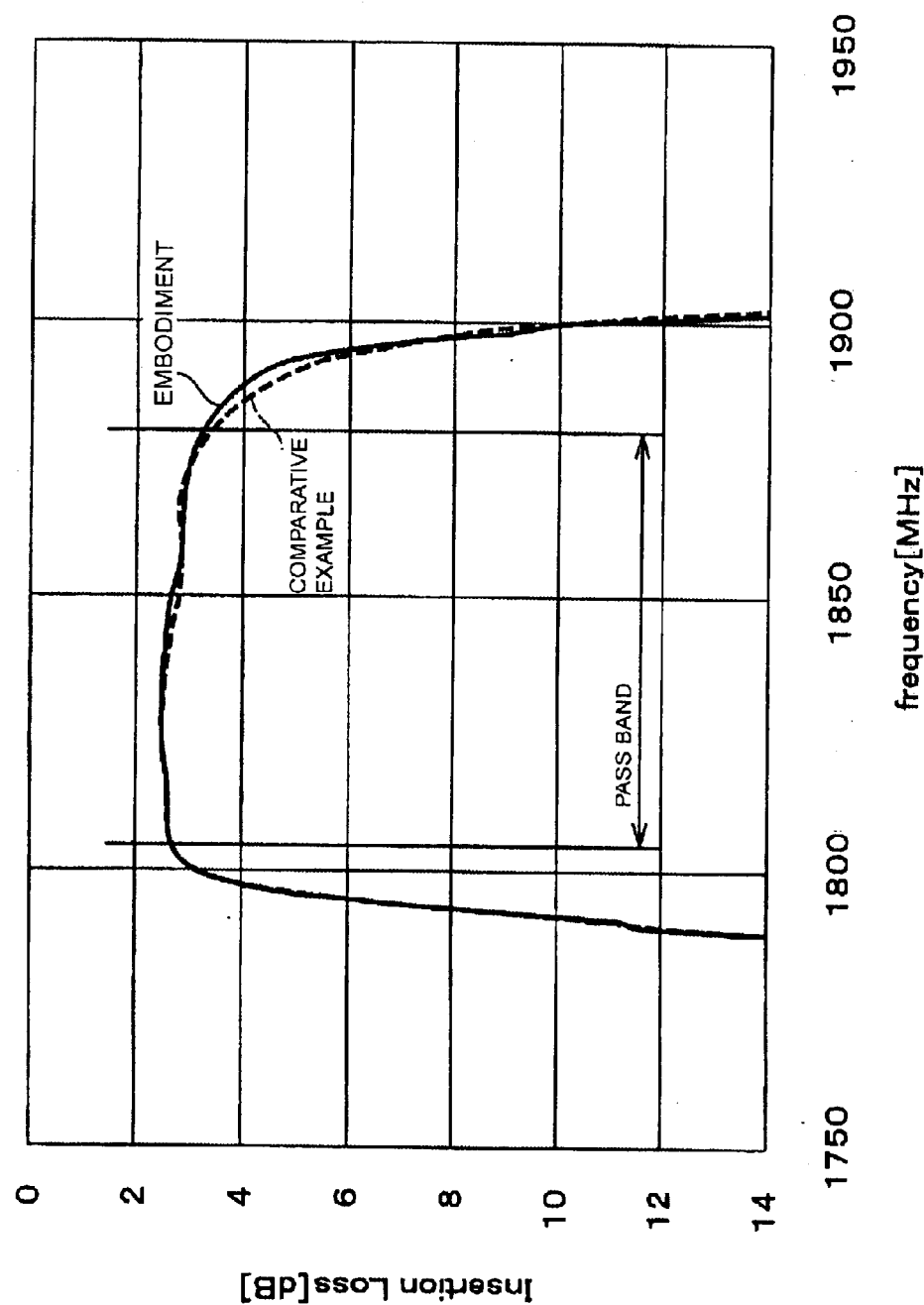
FIG. 3 is a graph illustrating insertion loss of the preferred embodiment and that of the known SAW device.
Figure 4:
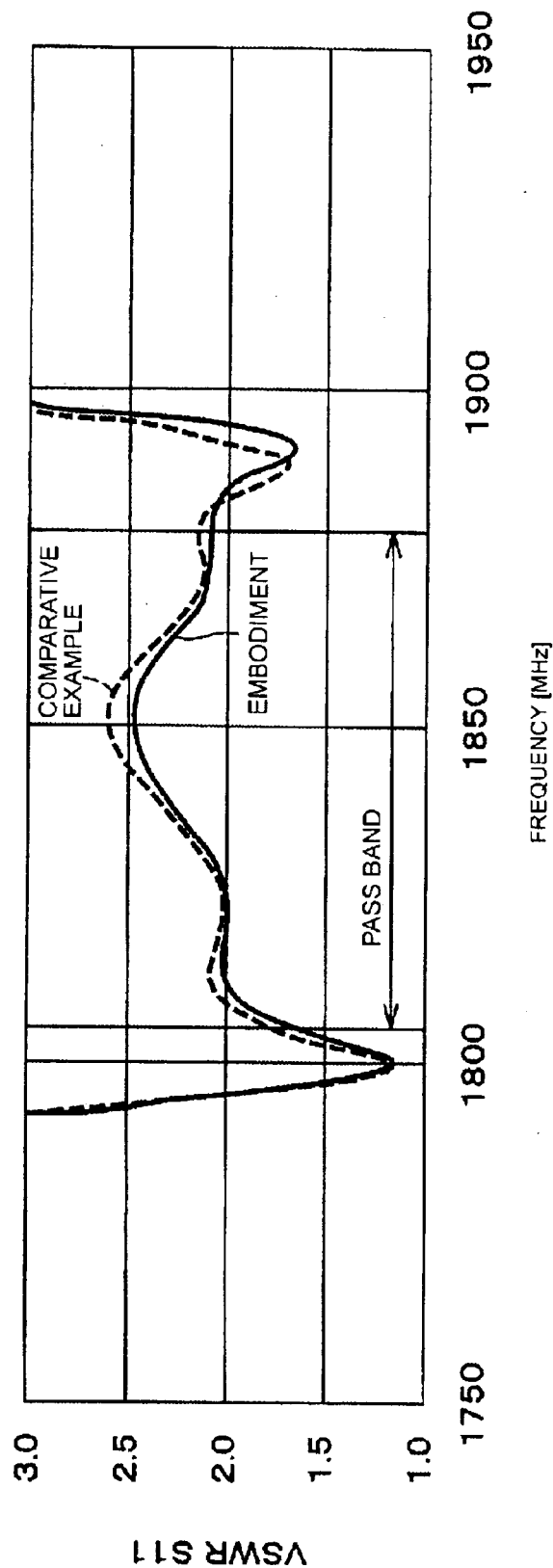
FIG. 4 is a graph illustrating a VSWR of the input side of each of the preferred embodiment and the known SAW device.
Figure 5:
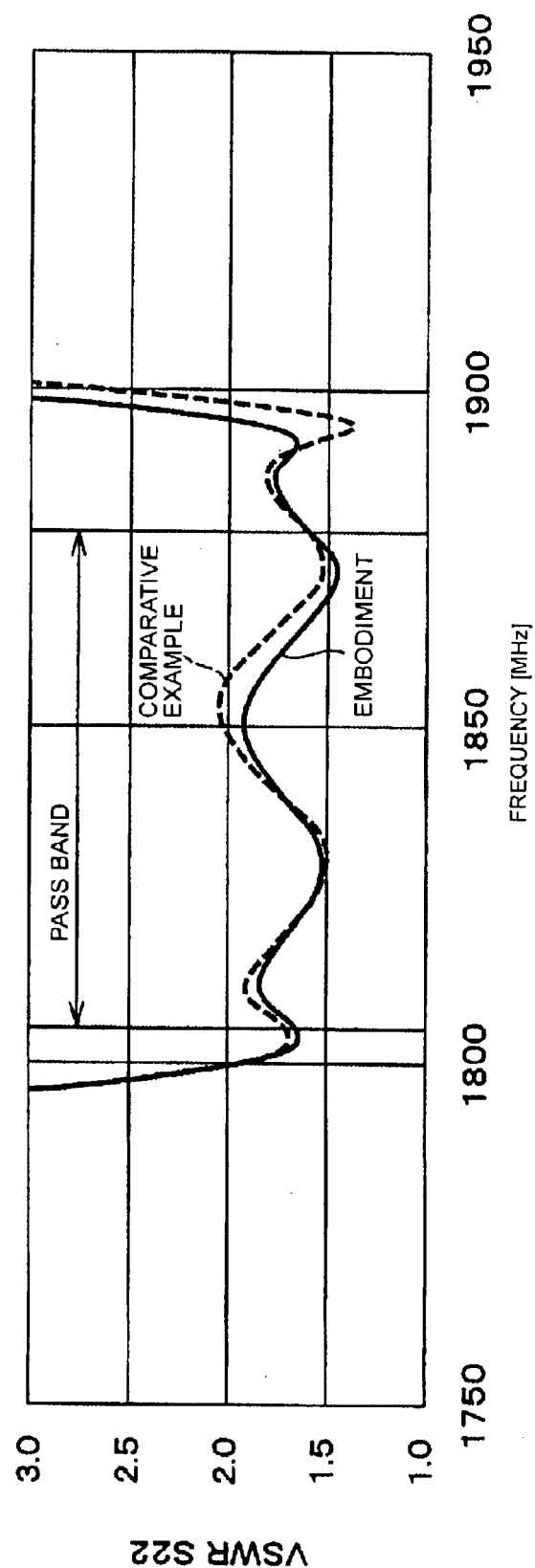
FIG. 5 is a graph illustrating a VSWR of the output side of each of the preferred embodiment and the known SAW device.
Figure 6:
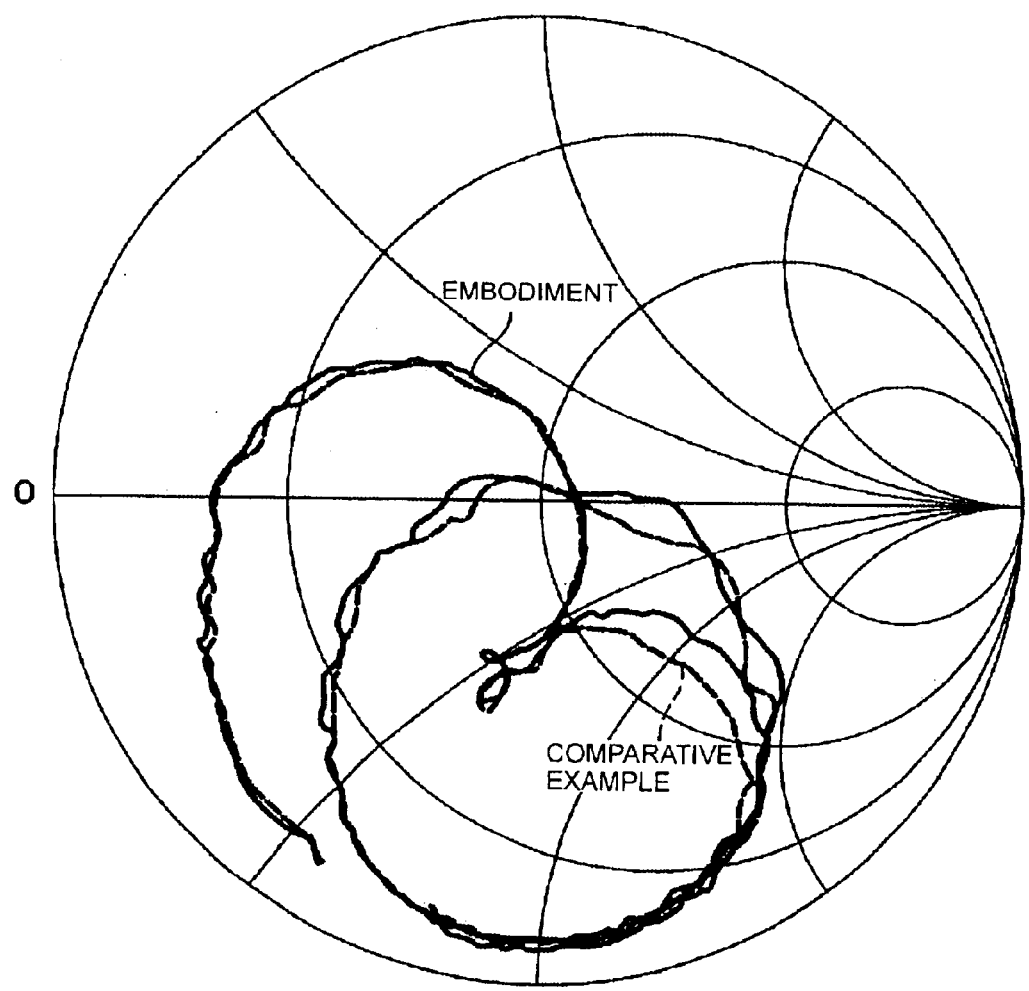
FIG. 6 is a Smith chart illustrating a reflection characteristic of the input side of each of the preferred embodiment and the known SAW device.

The operation and advantages of this preferred embodiment are described below. The transmission characteristic with respect to the frequency of the above-configured SAW device is shown in FIG. 3, and the VSWR of the input side (unbalanced signal terminal) and the VSWR of the output side (balanced signal terminals) are shown in FIGS. 4 and 5, respectively. For comparison, the transmission characteristic, the VSWR of the input side, and the VSWR of the output side with respect to the frequency of a known SAW device (comparative example) shown in FIG. 2 are shown in FIGS. 4, 5, and 6, respectively. The design of the SAW device shown in FIG. 2 is the same as that of this preferred embodiment, except that SAW resonators 123 and 124 are not provided with dummy electrodes, which are provided between the electrode fingers and the bus bars of the IDTs 223a and 224a of the SAW resonators 223 and 224 in this preferred embodiment.

The frequency range of the pass band of a DCS reception filter is preferably from 1805 MHz to 1880 MHz. FIG. 3 shows that the maximum insertion loss toward the high-frequency side within the pass band of this range of this preferred embodiment is less than that of the comparative example by about 0.2 dB.

The minimum insertion loss within the pass band other than at the high-frequency side is about the same in this preferred embodiment and in the comparative example. Thus, this preferred embodiment has a smaller deviation of the insertion loss within the pass band by about 0.2 dB. This preferred embodiment has a wider bandwidth with respect to the position of the insertion loss at 4 dB from the through level than the comparative example by about 4 MHz.

Accordingly, this preferred embodiment has a smaller insertion loss within the pass band caused by temperature changes, and a wider margin of manufacturing variations, thereby improving the yield. FIGS. 4 and 5 show that the VSWR of the input side and that of the output side of this preferred embodiment are lower than those of the comparative example by about 0.2. That is, the overall characteristics within the pass band of this preferred embodiment are greatly improved as compared to the comparative example.

Figure 7:
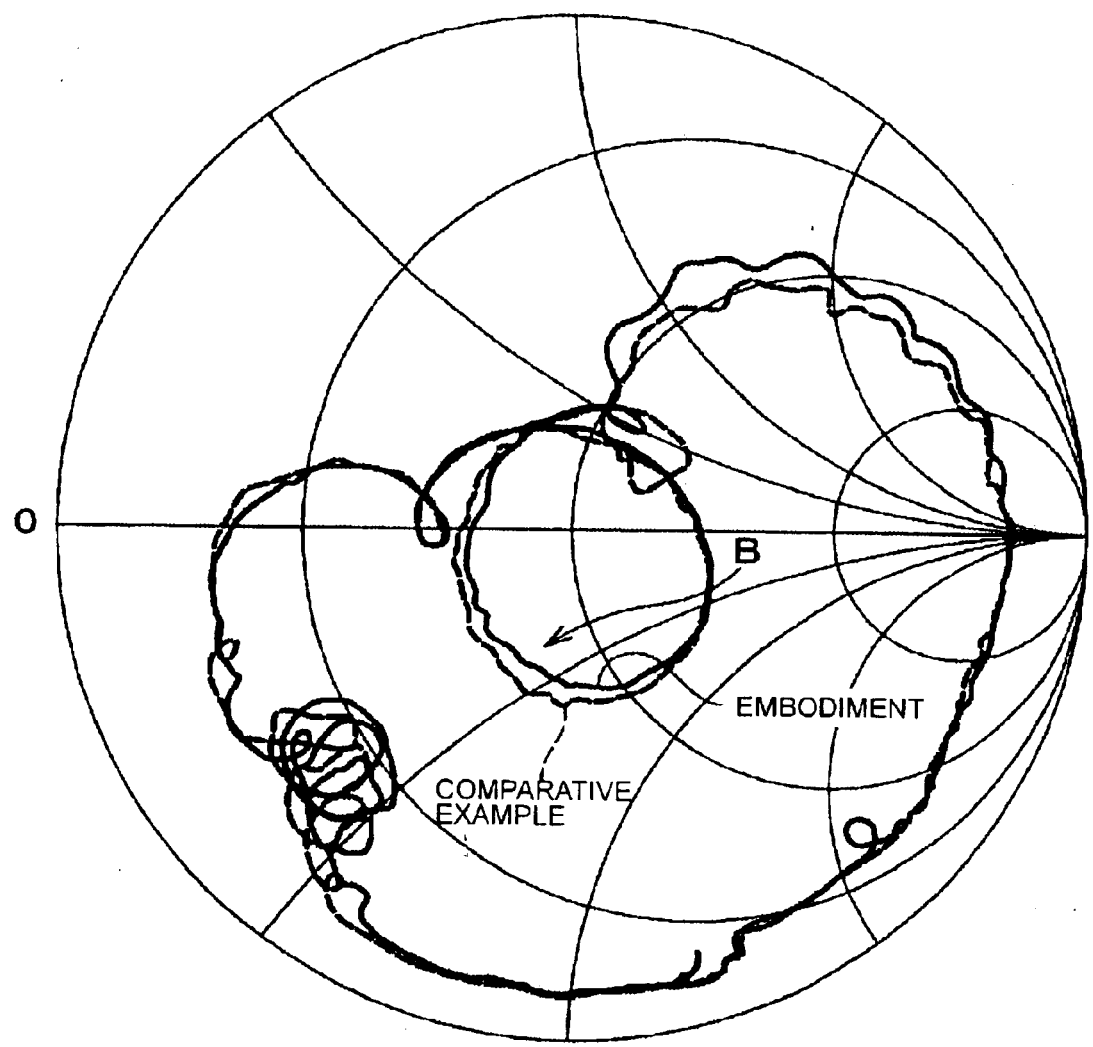
FIG. 7 is a Smith chart illustrating a reflection characteristic of the output side of each of the preferred embodiment and the known SAW device.

The reasons for achieving the above-described advantages are as follows. FIGS. 6 and 7 are diagrams obtained by plotting the reflection characteristics of this preferred embodiment and those of the comparative example on a Smith chart. FIG. 6 indicates the reflection characteristic of the input side, while FIG. 7 indicates the reflection characteristic of the output side. The substantial difference between this preferred embodiment and the comparative example is that the frequency side higher than the resonance point indicated by B is capacitive in the comparative example. This is due to the above-described generation of a spurious response in the SAW resonators, which is caused by a SSBW, between the resonant frequency and the antiresonant frequency.

Figure 8:
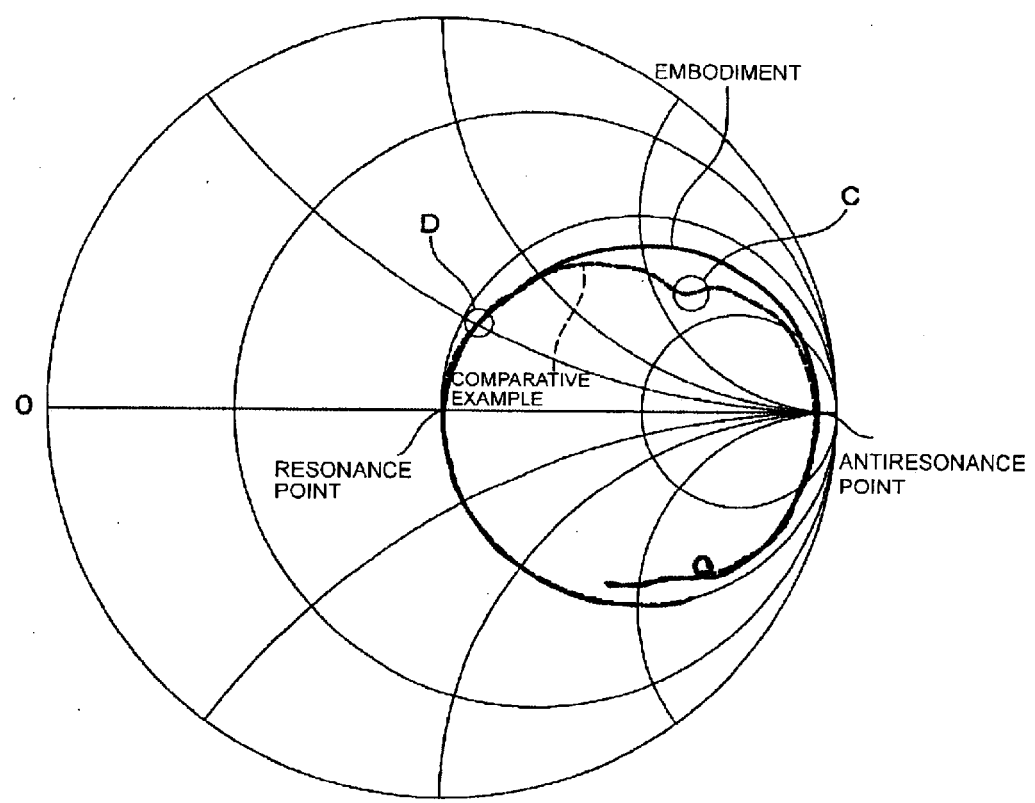
FIG. 8 is a Smith chart illustrating a reflection characteristic of the input side of SAW resonators used in each of the preferred embodiment and the known SAW device.
Figure 9:
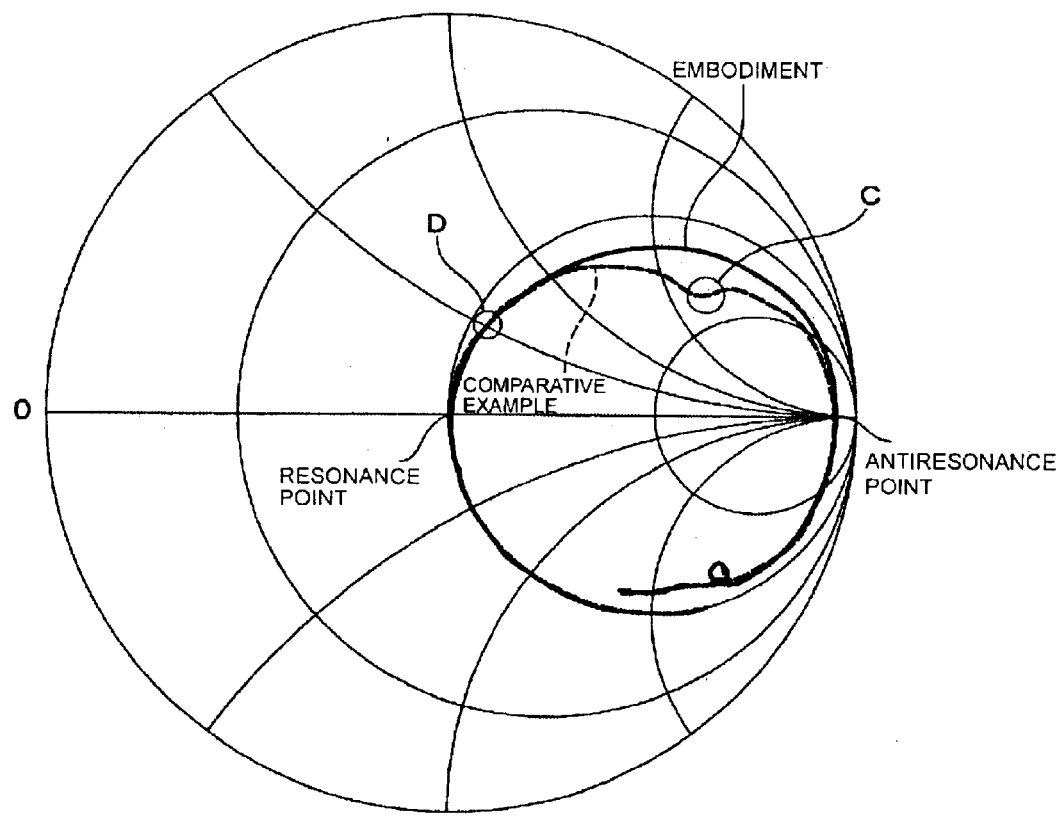
FIG. 9 is a Smith chart illustrating a reflection characteristic of the output side of the SAW resonators used in each of the preferred embodiment and the known SAW device.

FIGS. 8 and 9 illustrate the reflection characteristics of the SAW resonators provided with dummy electrodes of this preferred embodiment and those of the SAW resonators without dummy electrodes of the comparative example when the impedance of the input side and the output side is about 50 Ω. FIG. 8 indicates the reflection characteristic of the input side, and FIG. 9 indicates the reflection characteristic of the output side.

In the SAW resonators of the comparative example, the resonance point C is generated between the resonant frequency and the antiresonant frequency due to an influence of a spurious response caused by a SSBW. Because of this influence, the impedance is shifted farther to the capacitive side as compared to the reflection characteristic of the SAW resonators of this preferred embodiment.

In the frequency range between the resonant frequency and the antiresonant frequency, there is a dip at the high-frequency side of the filter characteristic of the comparative example. The dip is generated due to a capacitive impedance in the SAW resonators in this frequency range.

A spurious response caused by a SSBW is generated, as indicated by D in FIGS. 8 and 9, in the reflection characteristic of this preferred embodiment. However, by providing dummy electrodes between the electrode fingers and the bus bars of the IDTs 223a and 224a of the SAW resonators 223 and 224, the spurious responses is shifted to the resonant frequency, thereby suppressing the influence of the spurious responses on the filter characteristics.

Figure 10:
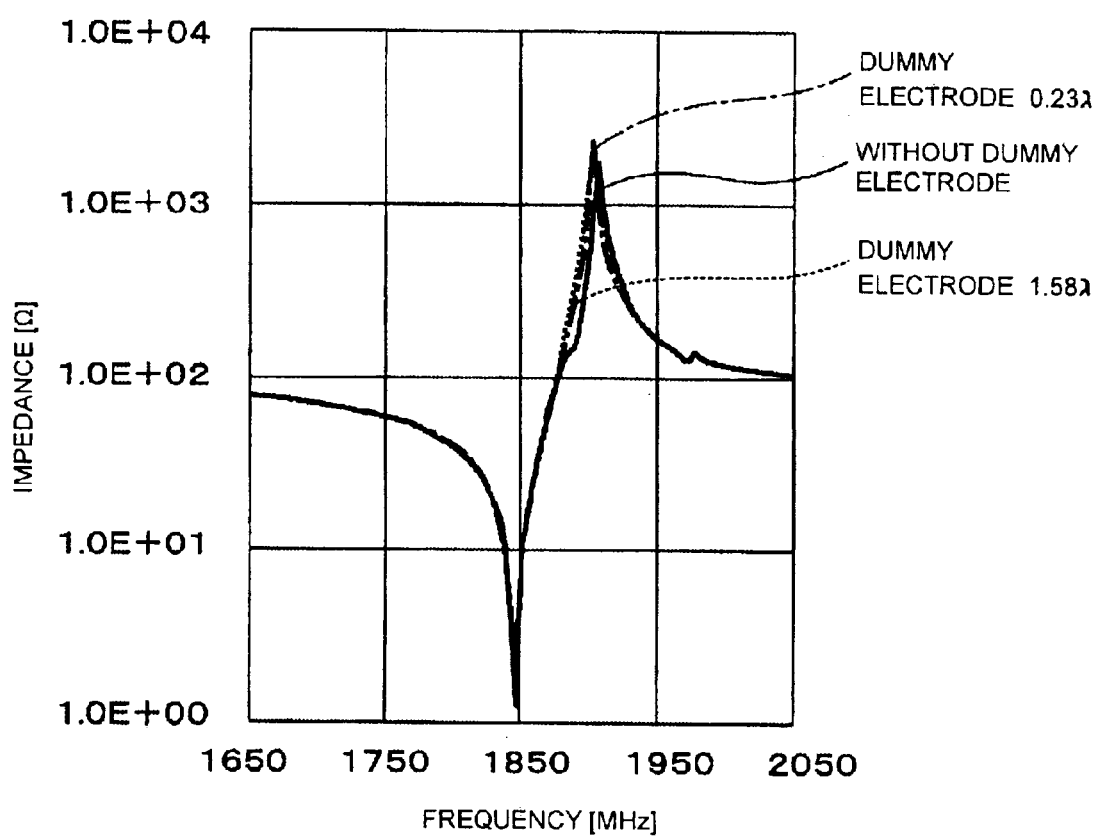
FIG. 10 is a graph illustrating a frequency-vs.-impedance characteristic of the SAW resonators according to a variation in the length of dummy electrodes.
Figure 11:
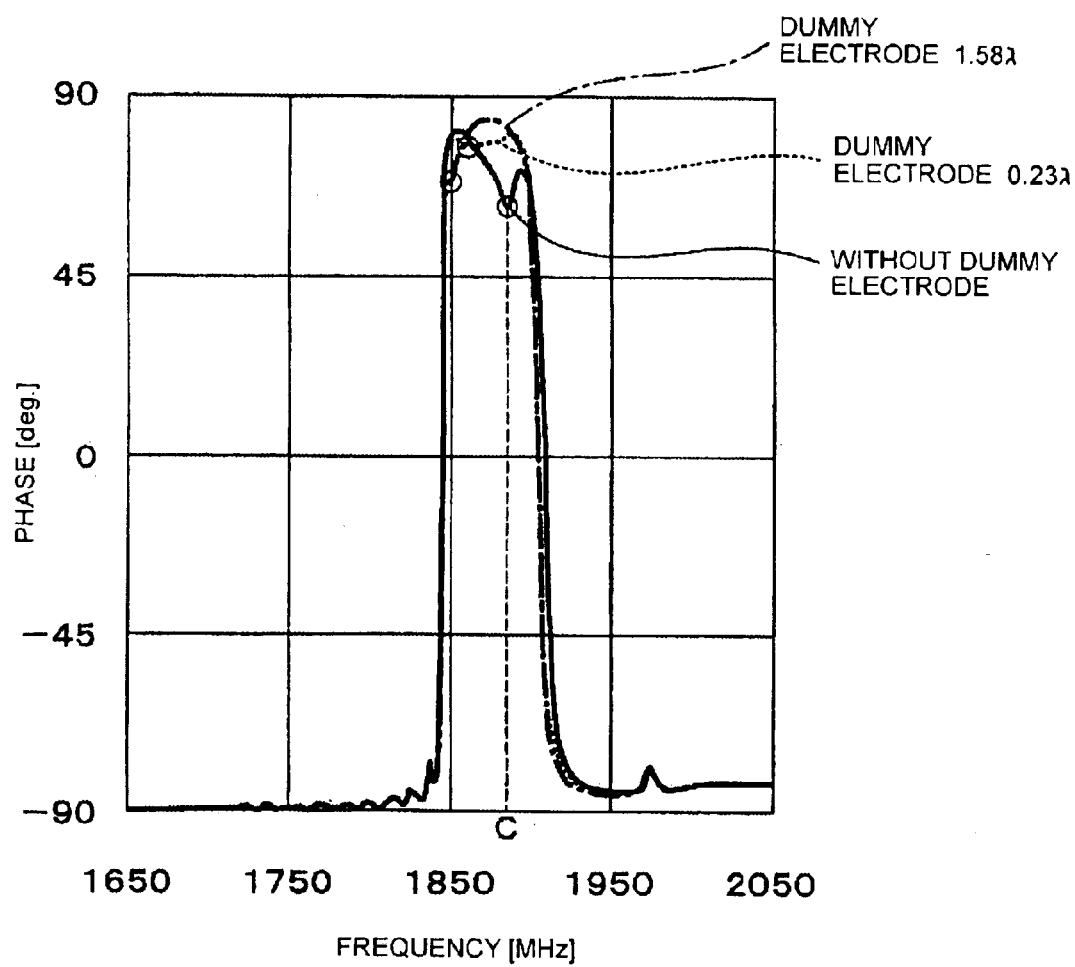
FIG. 11 is a graph illustrating a frequency-vs.-phase characteristic of the SAW resonators according to a variation in the length of the dummy electrodes.

The inventors of this application have discovered by experimentation that the frequency of the spurious responses caused by a SSBW is shifted to the resonant frequency by providing the dummy electrodes 228 between the electrode fingers and the bus bars of the IDTs 223a and 224a. FIGS. 10 and 11 show an impedance change and a phase change, respectively, where the dummy electrodes 228 are provided between the electrode fingers and the bus bars of the IDTs 223a and 224a, when the dummy electrodes 228 are not provided, and when the length of the dummy electrodes 228 are changed.

The phase distortions shown in FIG. 11 clearly indicate that a spurious response is generated closer to the resonant frequency when the dummy electrodes 228 having a length of about 0.23λ (λ designates the wavelength determined by the pitch of the electrode fingers of the IDTs 223a and 224a of the SAW resonators) are provided as compared to when the dummy electrodes 228 are not provided, though such a feature is not clearly noticeable in the impedance change shown in FIG. 10.

Figure 12:
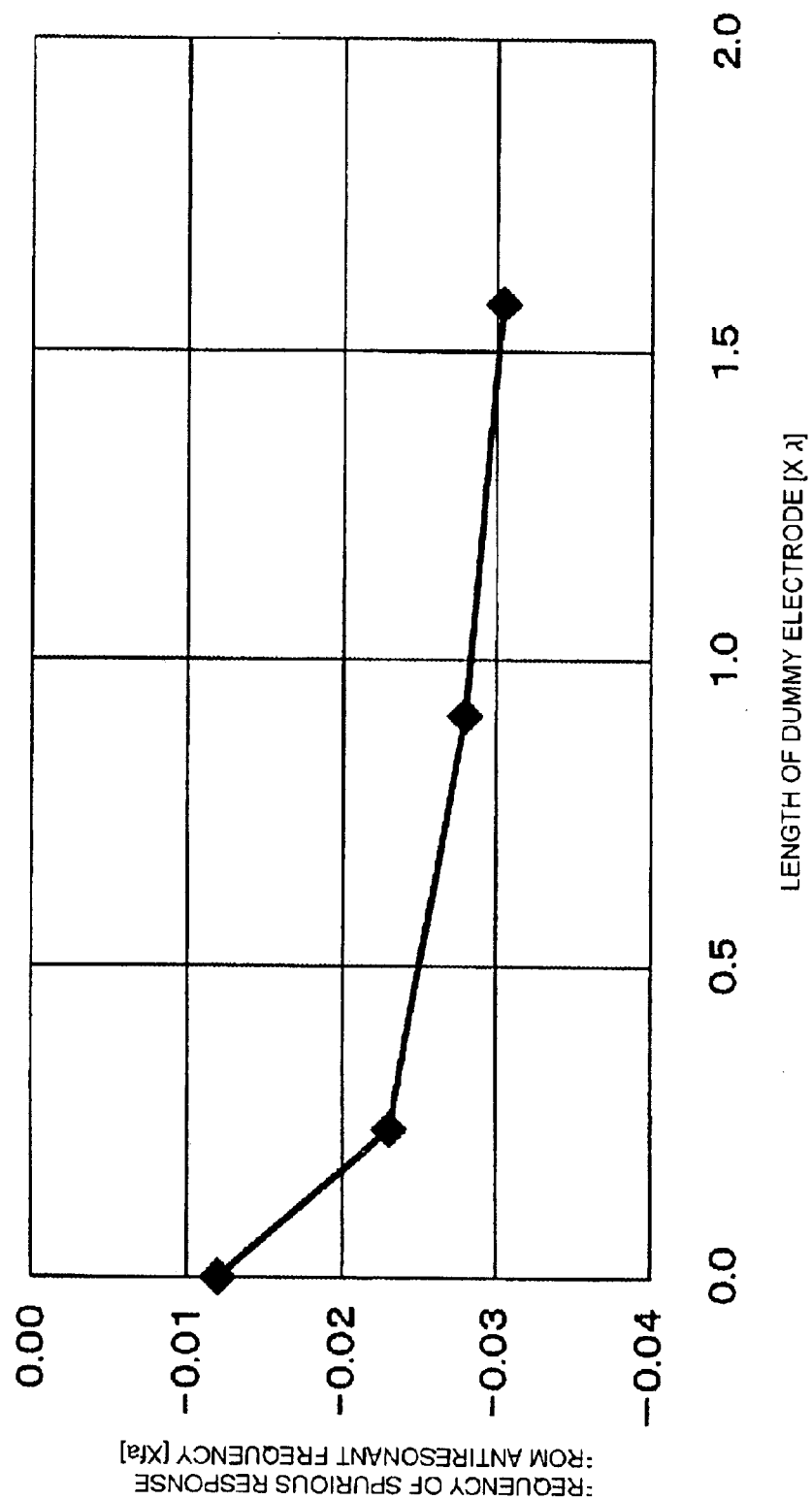
FIG. 12 is a graph illustrating a change in a spurious response of the SAW resonators according to a variation in the length of the dummy electrodes.

As the length of the dummy electrodes 228 is increased to about 1.58λ, the spurious response is shifted to closer to the resonant frequency. A graph indicated by the frequency of the spurious response (standardized by the antiresonant frequency (fa)) with respect to the length of the dummy electrodes 228 is shown in FIG. 12. FIG. 12 shows that the frequency of the spurious response moves away from the antiresonant frequency and closer to the resonant frequency as the length of the dummy electrodes 28 is increased.

As the length of the dummy electrodes 228 is increased to about 0.25λ, the frequency of the spurious response is abruptly reduced toward the resonant frequency. As the length of the dummy electrodes 228 is increased to greater than about 0.25λ, however, a decrease in the frequency of the spurious response toward the resonant frequency gradually reduces. That is, great advantages are obtained by setting the length of the dummy electrodes 228 to be at least about 0.25λ.

Accordingly, an increased length of the dummy electrodes 228 shifts the frequency of a spurious response (dip) to the lower frequency side, and also decreases the level of the dip. This is because the impedance of the spurious response approaches the matching point (almost the same as the resonance point, see FIGS. 8 and 9). When the impedance is close to the matching point, a slight variation in the impedance does not substantially change the characteristics. Accordingly, the level of a spurious response is suppressed, and the phase distortions are greatly reduced, as shown in FIGS. 10 and 11.

When the frequency of the spurious response (dip) is shifted to the lower frequency side, it is sometimes located within the pass band. As stated above, however, since the influence of a spurious response is inhibited, the transmission characteristic within the pass band does not substantially change.

The frequency of a spurious response also changes by varying the gap between the electrode fingers and the bus bars of the IDTs 223a and 224a, or the gap between the electrode fingers of the IDTs 223a and 224a and the dummy electrodes 228.

Conversely, however, unlike the length of the dummy electrodes 228, the frequency of a spurious response is shifted to the antiresonant frequency as the gap between the electrode fingers and the bus bars of the IDTs 223a and 224a or the gap between the electrode fingers of the IDTs 223a and 224a and the dummy electrodes 228 increases.

Figure 13:
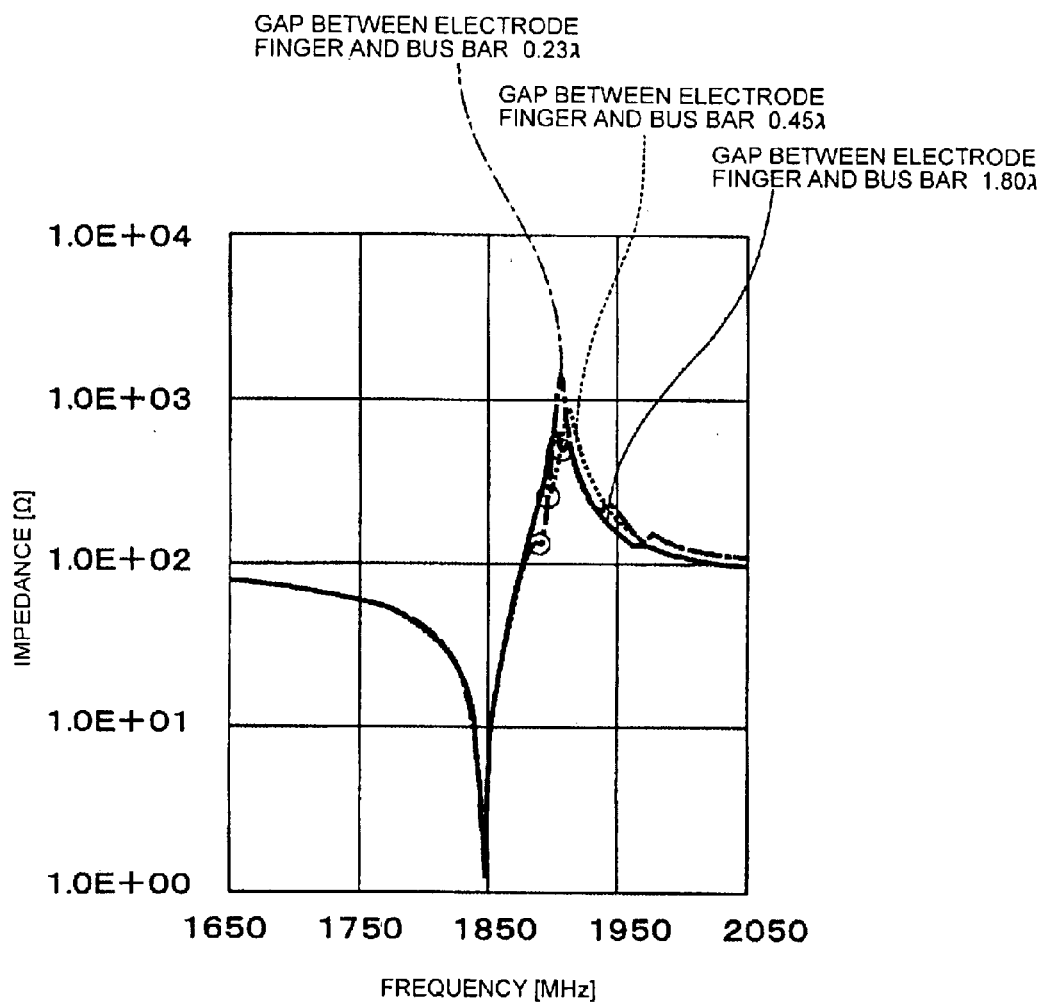
FIG. 13 is a graph illustrating a frequency-vs.-impedance characteristic of the SAW resonators according to a variation in the gap between the electrode fingers and the bus bars of IDTs of the SAW resonators.
Figure 14:
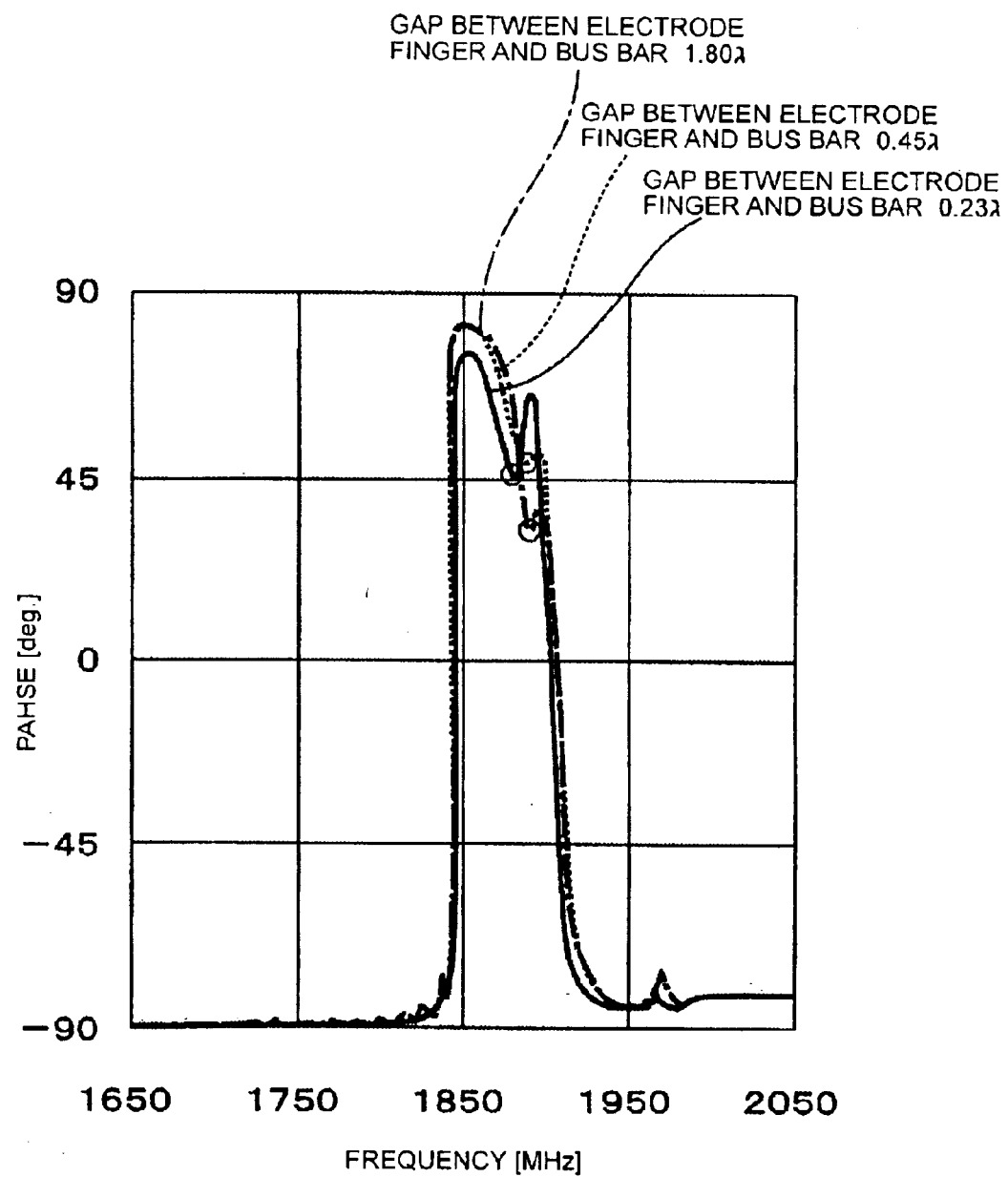
FIG. 14 is a graph illustrating a frequency-vs.-phase characteristic of the SAW resonators according to a variation in the gap between the electrode fingers and the bus bars of the IDTs of the SAW resonators.
Figure 15:
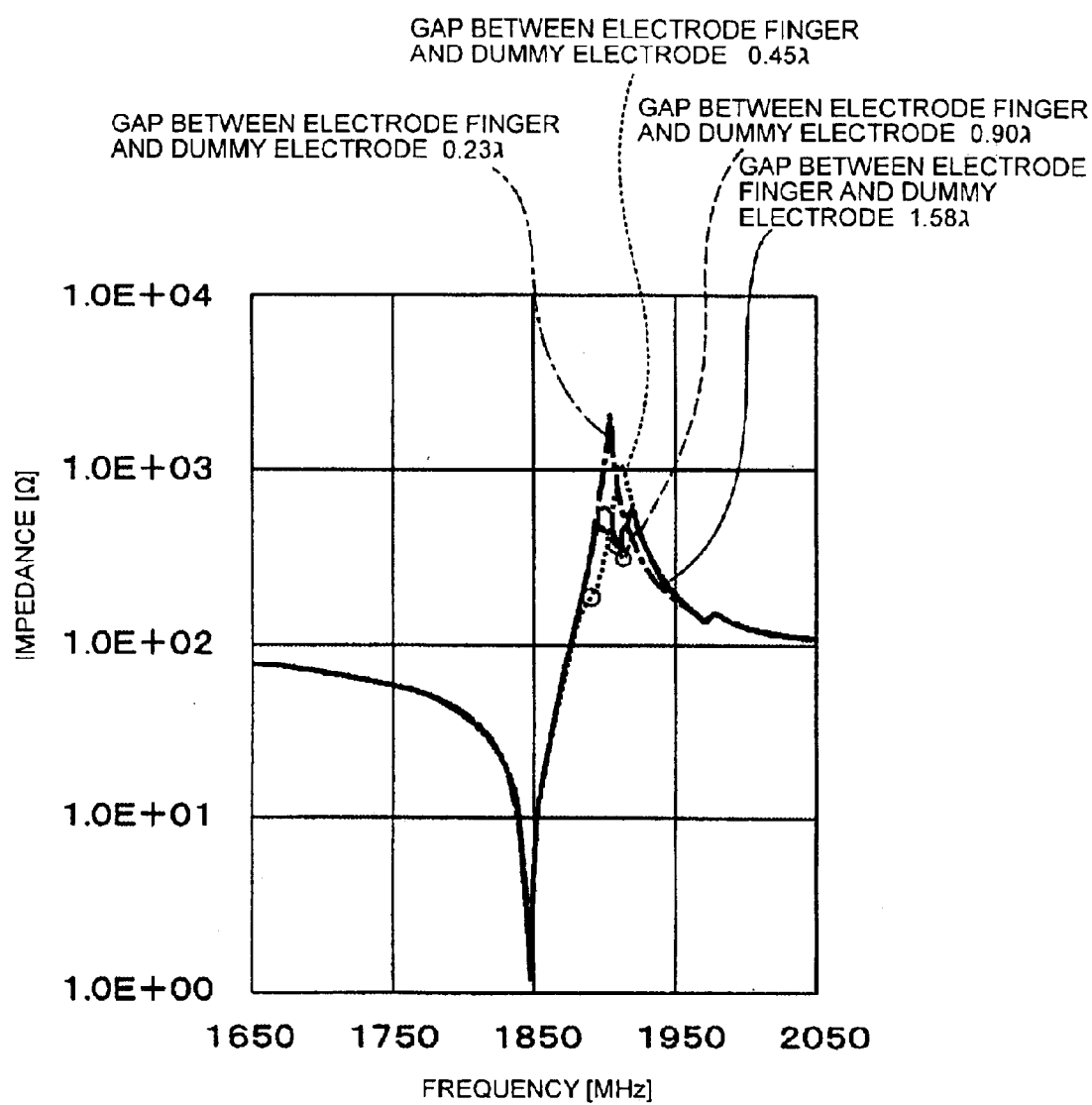
FIG. 15 is a graph illustrating a frequency-vs.-impedance characteristic of the SAW resonators according to a variation in the gap between the electrode fingers of the IDTs and the dummy electrodes of the SAW resonators.
Figure 16:
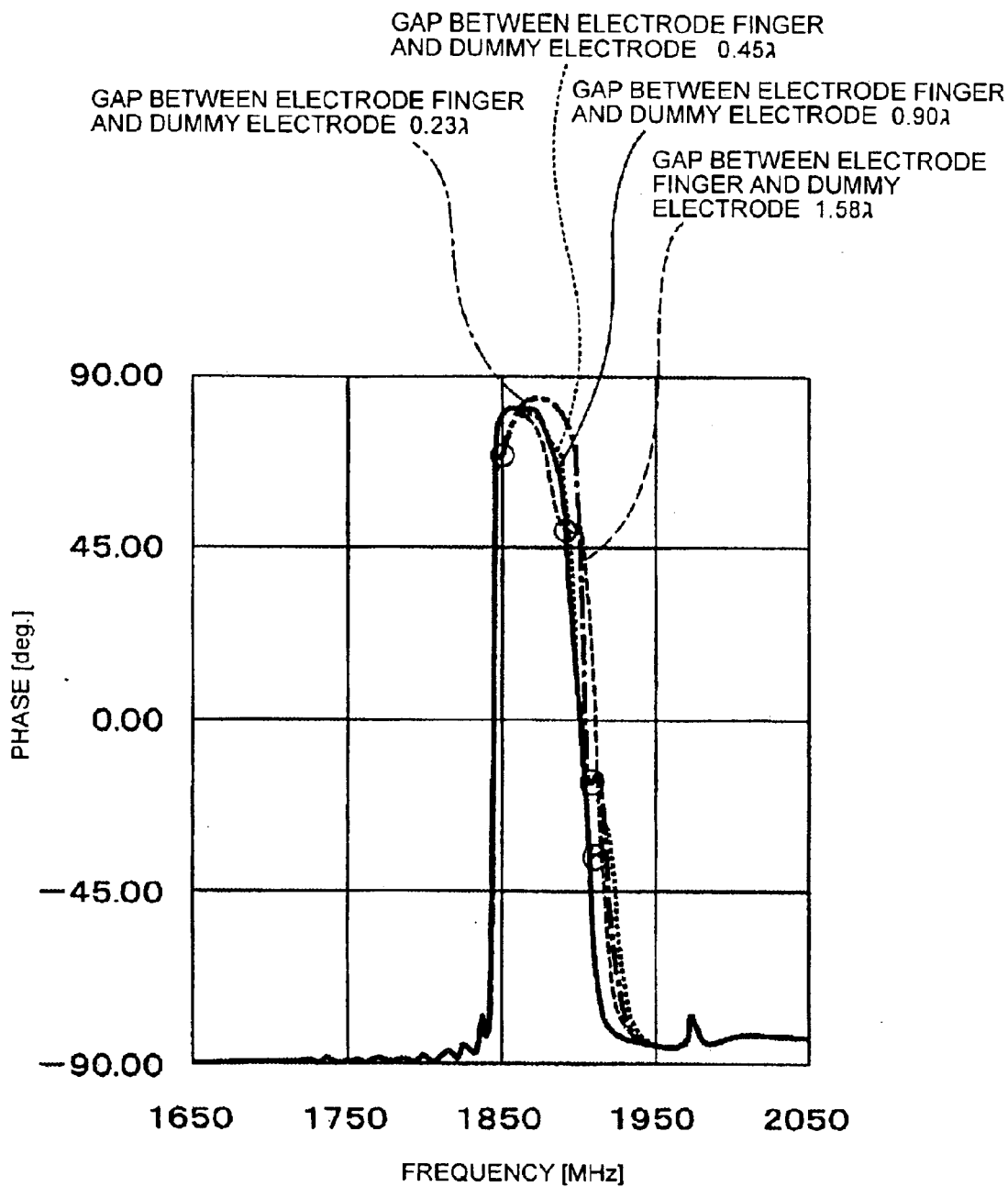
FIG. 16 is a graph illustrating a frequency-vs.-phase characteristic of the SAW resonators according to a variation in the gap between the electrode fingers of the IDTs and the dummy electrodes of the SAW resonators.

FIGS. 13 and 14 illustrate a change in the frequency of a spurious response according to a variation in the gap between the electrode fingers and the bus bars of the IDTs 223a and 224a. FIGS. 15 and 16 illustrate a change in the frequency of a spurious response according to a variation in the gap between the electrode fingers of the IDTs 223a and 224a and the dummy electrodes 228. FIGS. 15 and 16 show the results when the length of the dummy electrodes 228 is about 1.58λ. FIGS. 13 through 16 illustrate that the frequency of a spurious response is shifted to the antiresonant frequency as the gap between the electrode fingers and the bus bars or the gap between the electrode fingers and the dummy electrodes increases.

To suppress the influence of the spurious response on the filter characteristic, it has been considered that the gap between the electrode fingers and the bus bars of the IDTs 223a and 224a or the gap between the electrode fingers of the IDTs 223a and 224a and the dummy electrodes 228 is increased to shift the spurious response to a frequency greater than the antiresonant frequency.

In this case, however, the impedance of the antiresonant frequency decreases, as shown in FIGS. 13 and 15, and thus, sufficient attenuation cannot be obtained outside the pass band very close to the pass band. It is therefore desirable that a spurious response caused by a SSBW is located within the pass band, as in this preferred embodiment, rather than in a frequency close to the antiresonant frequency, i.e., outside the pass band. If the spurious response is located outside the pass band, the diffraction loss also increases so as to reduce the Q factor of the SAW resonators, thereby increasing the insertion loss of the filter characteristic. That is, by providing the dummy electrodes 228 and by setting the gap between the electrode fingers of the IDTs 223a and 224a and the dummy electrodes 228 to a minimal value, advantages of the present invention are more effectively achieved.

Figure 17:
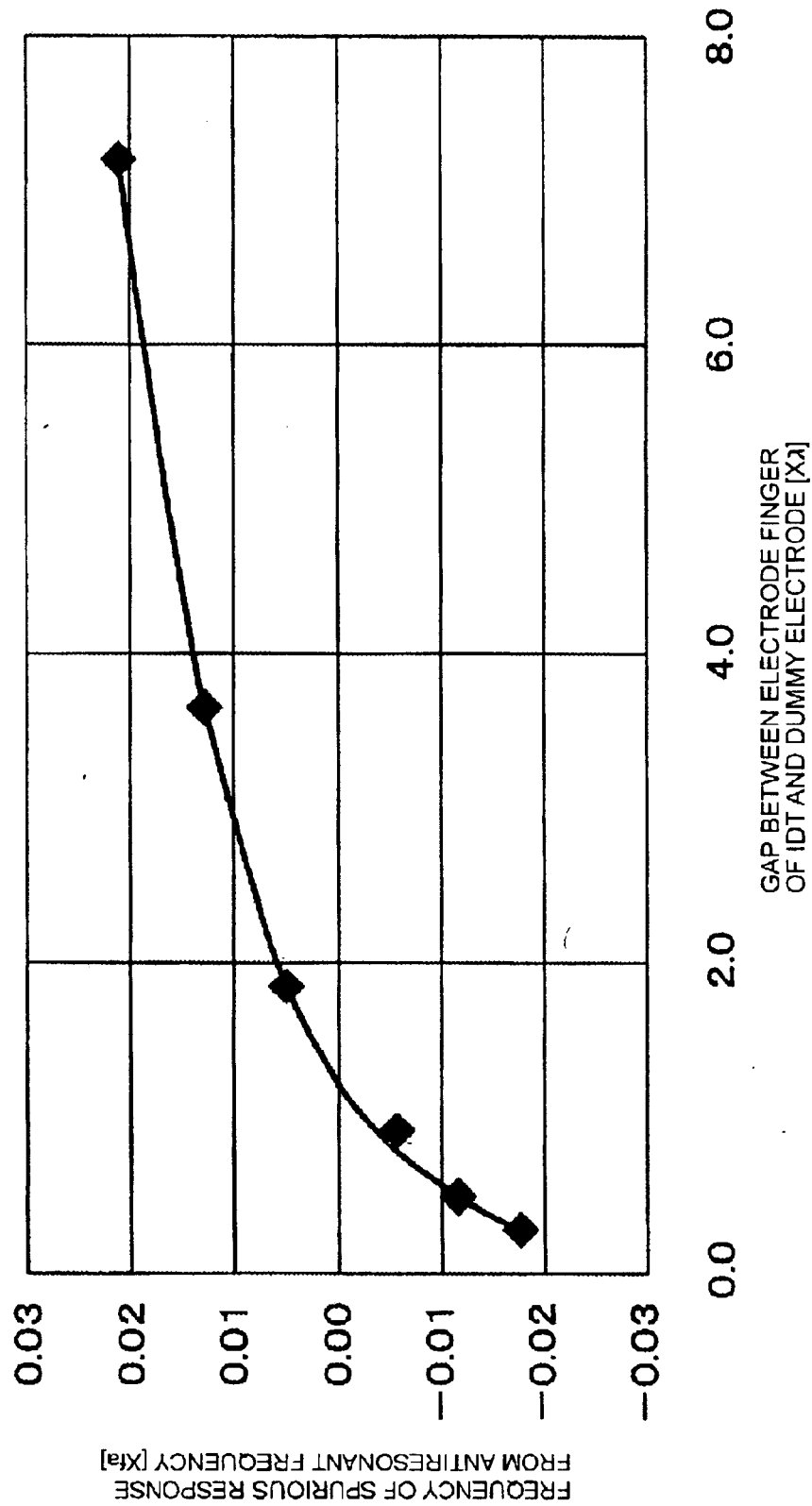
FIG. 17 is a graph illustrating a change in the frequency of a spurious response of the SAW resonators according to a variation in the gap between the electrode fingers of the IDTs and the dummy electrodes of the SAW resonators.

The frequency of a spurious response (standardized by the antiresonant frequency (fa)) with respect to the gap (standardized by $\lambda$) between the electrode fingers of the IDTs 223a and 224a and the dummy electrodes 228 is shown in FIG. 17. The graph in FIG. 17 incorporates the results shown in FIGS. 15 and 16 when the length of the dummy electrodes 228 is about 1.58$\lambda$.

FIG. 12 shows that the amount by which the frequency of a spurious response is shifted decreases (more saturated) as the length of the dummy electrodes 228 increases. When the frequency of the spurious response positioned at about 1.58$\lambda$ of the length of the dummy electrodes 228 is closer to the antiresonant frequency than that of the comparative example (without dummy electrodes), advantages of this preferred embodiment are not effectively achieved. FIG. 17 shows that the frequency of the spurious response when the gap between the electrode fingers of the IDTs 223a and 224a and the dummy electrodes 228 is about 0.5$\lambda$ almost coincides with that of the comparative example. Thus, the gap between the electrode fingers of the IDTs 223a and 224a and the dummy electrodes 228 is preferably about 0.5$\lambda$ or smaller.

Figure 18:
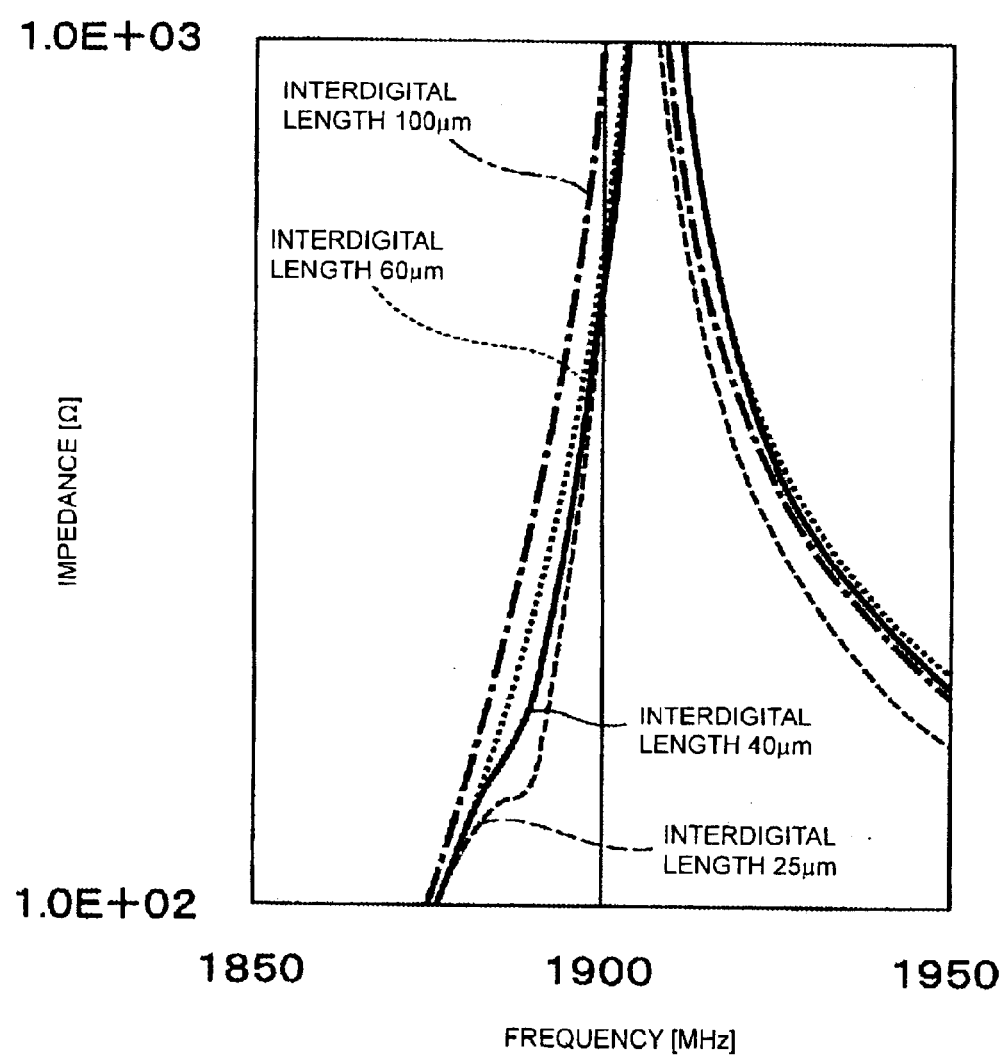
FIG. 18 is a graph illustrating a frequency-vs.-impedance characteristic of the SAW resonators according to a variation in the interdigital length of the IDTs of the SAW resonators.
Figure 19:
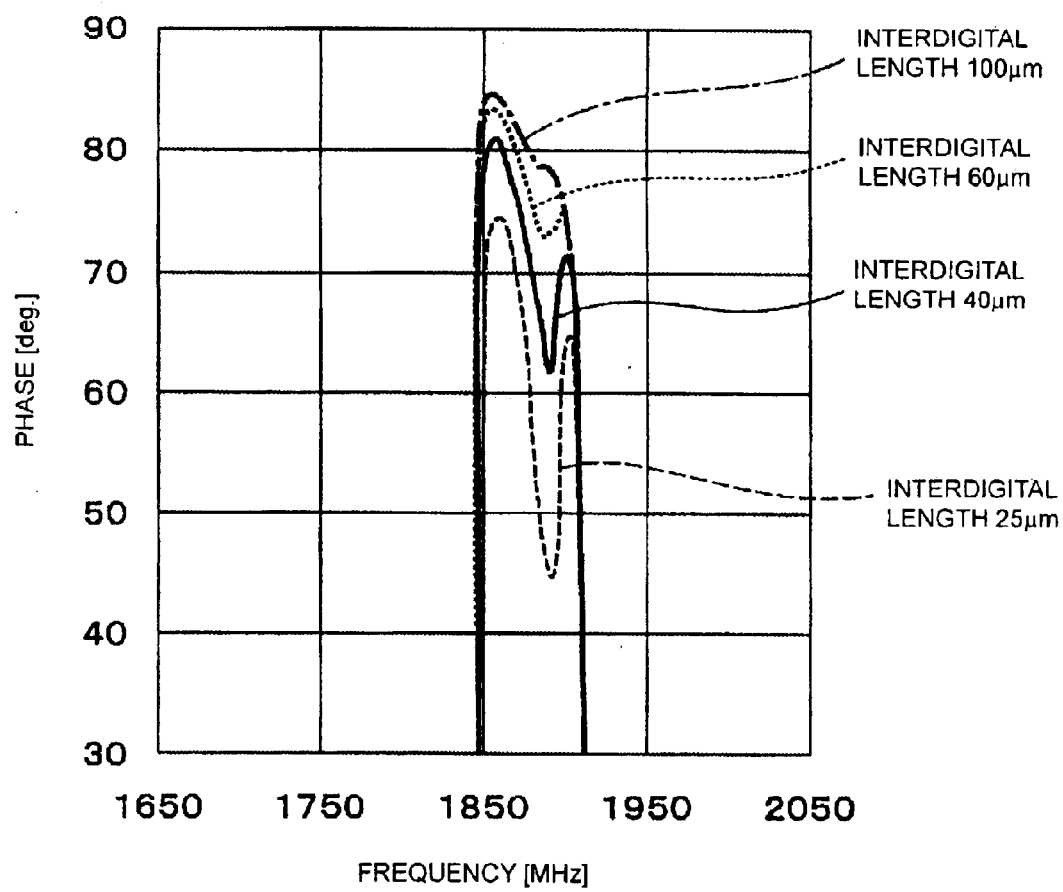
FIG. 19 is a graph illustrating a frequency-vs.-phase characteristic of the SAW resonators according to a variation in the interdigital length of the IDTs of the SAW resonators.

Additionally, the level of a spurious response is changed by varying the interdigital length of the IDTs 223a and 224a of the SAW resonators. FIGS. 18 and 19 illustrate a change in the spurious response according to a variation in the interdigital length of the IDTs 223a and 224a. In this case, the number of pairs of electrode fingers of each SAW resonator is adjusted by an amount by which the interdigital length is changed so as not to change the capacitance of the SAW resonators.

FIGS. 18 and 19 show that the level of a spurious response is reduced as the interdigital length is increased. When the interdigital length is increased to about 100 $\mu$m, the generation of a spurious response is approximately zero. This eliminates the necessity of providing dummy electrodes, as has been done in this preferred embodiment. In other words, advantages of the present invention are not achieved unless the interdigital length of the electrode fingers of the IDTs 223a and 224a of the SAW resonators is about 100 $\mu$m or less (about 45$\lambda$ or less, where the wavelength determined by the pitch between adjacent electrode fingers of the IDTs 223a and 224a is indicated by $\lambda$).

According to this preferred embodiment, a SAW device includes SAW resonators connected in series to longitudinally coupled resonator SAW filters, each having three IDTs in a SAW propagating direction, on a piezoelectric substrate. Dummy electrodes are provided between the electrode fingers and the bus bars of the IDTs of the SAW resonators, and the gap between the dummy electrodes and the electrode fingers of the IDTs is about 0.5$\lambda$ or less. Thus, a SAW device having a reduced insertion loss within a pass band, a wider band, and a lower VSWR as compared to a known SAW device is achieved.

This preferred embodiment has been described in the context of a SAW device having a balanced-to-unbalanced conversion function. However, other configurations are applicable to the present invention as long as a SAW resonator having an interdigital length of about 100 $\mu$m (about 45$\lambda$, where the wavelength determined by the pitch between adjacent electrode fingers of the IDTs 223a and 224a is indicated by $\lambda$) or less is connected in series to a SAW filter. In this case, advantages similar to those of this preferred embodiment are achieved.

Figure 20:
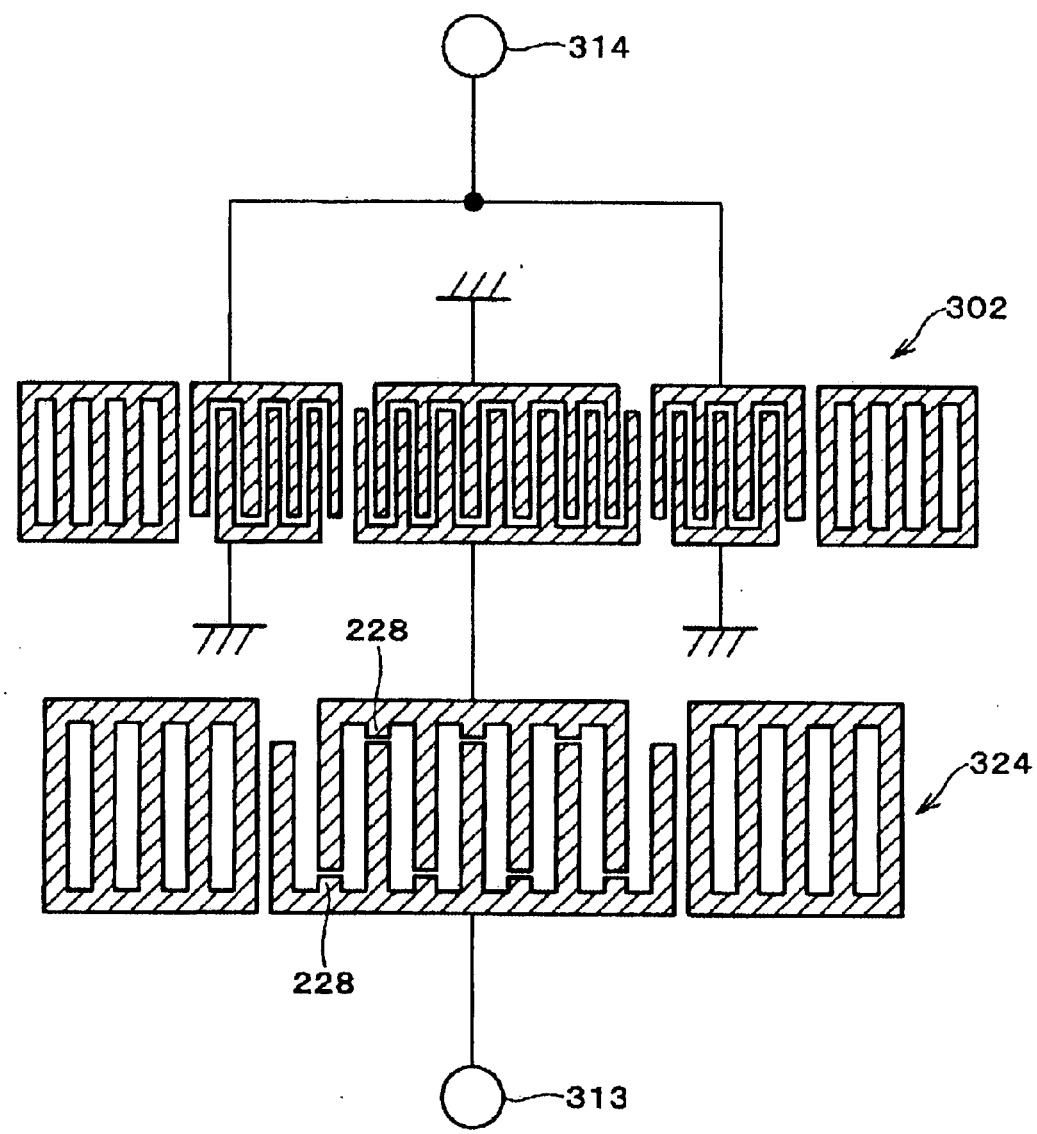
FIG. 20 is a schematic diagram illustrating a SAW device according to another preferred embodiment of the present invention.
Figure 21:
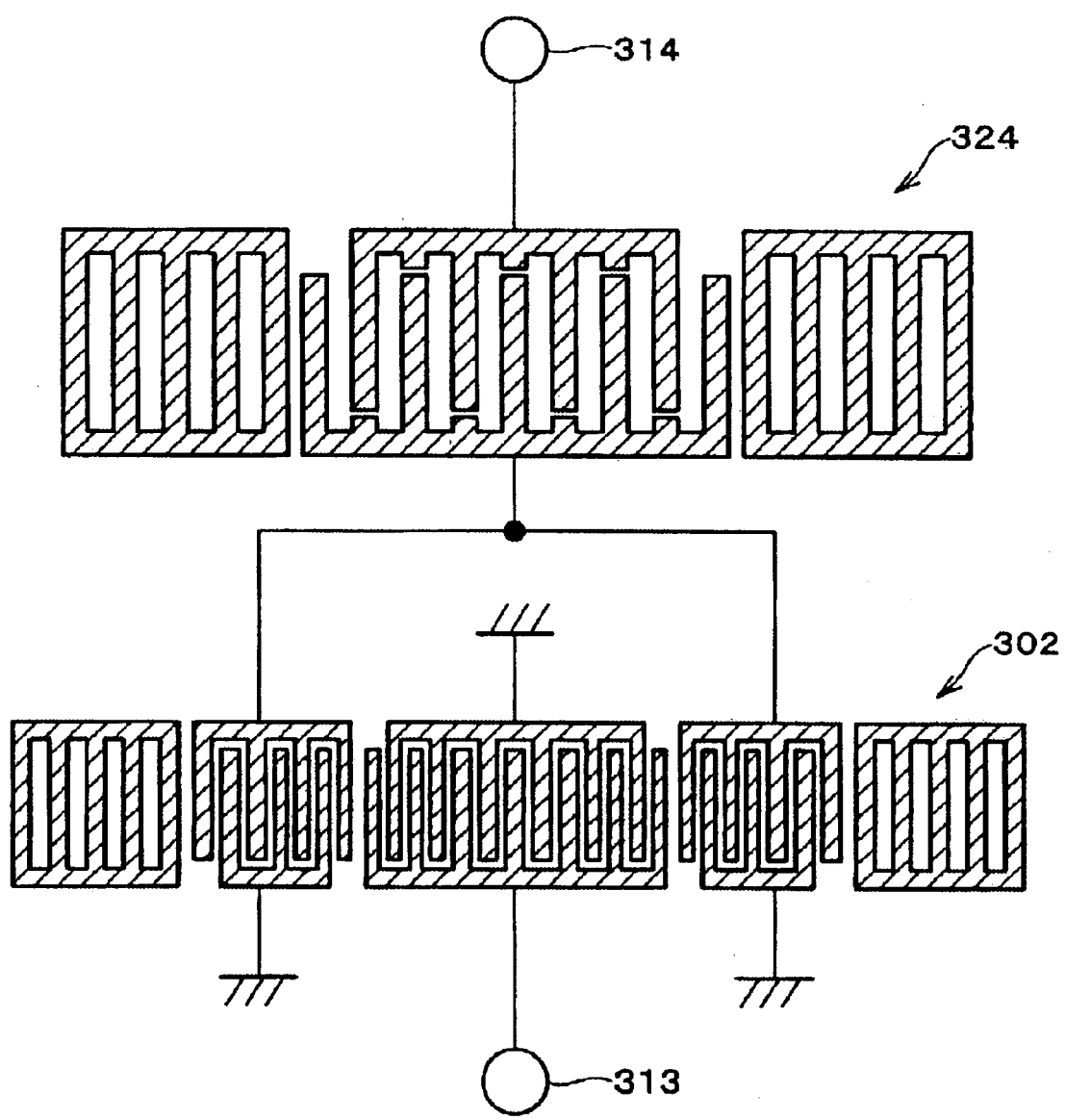
FIG. 21 is a schematic diagram illustrating a SAW device according to another preferred embodiment of the present invention.
Figure 22:
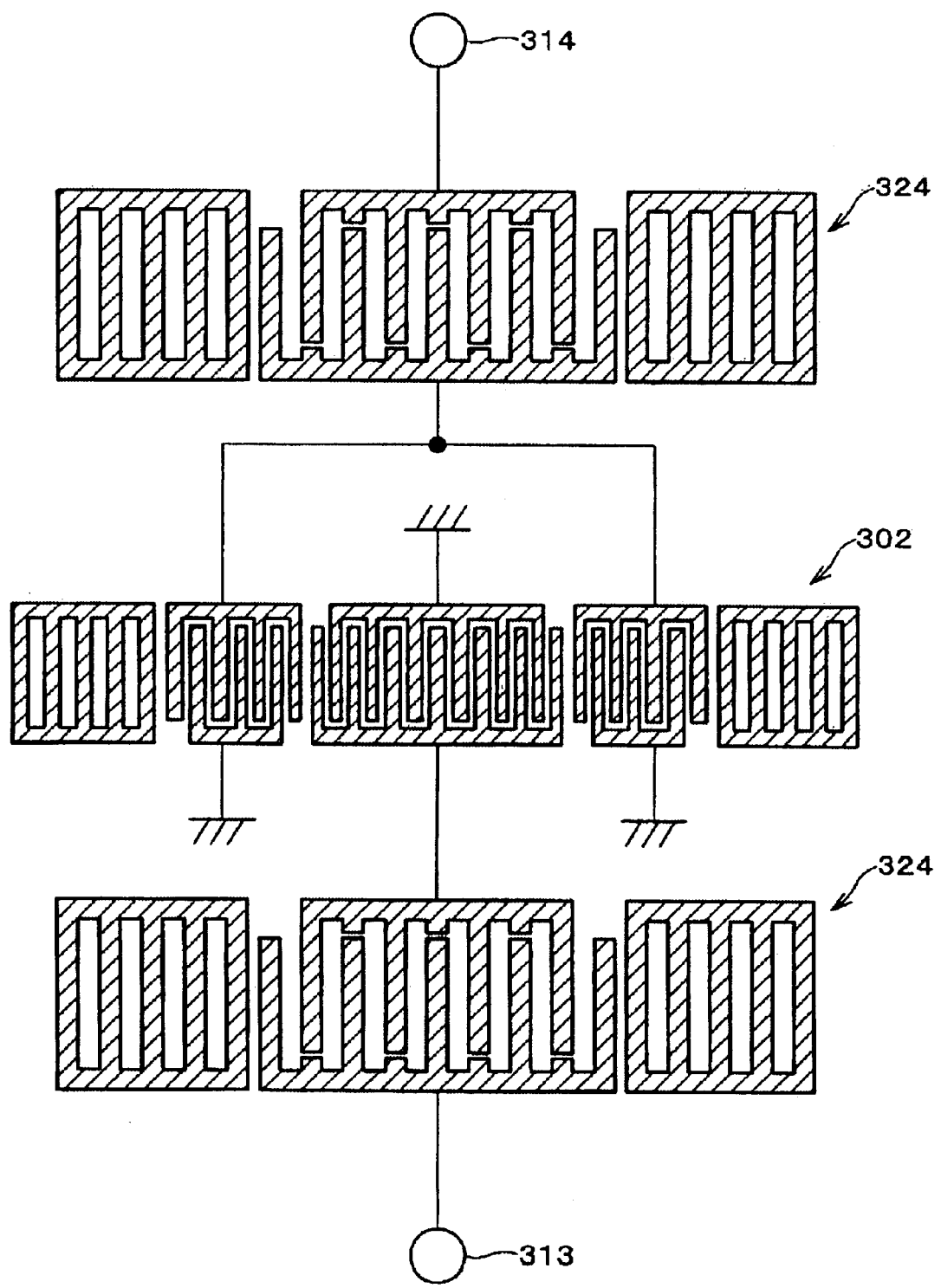
FIG. 22 is a schematic diagram illustrating a SAW device according to still another preferred embodiment of the present invention.

Modified examples of this preferred embodiment are as follows. FIG. 20 illustrates a SAW device without an unbalanced-to-balanced conversion function which includes a single SAW resonator 324 provided with the dummy electrodes 228 and arranged between a longitudinally coupled resonator SAW filter 302 and an output terminal 313. FIG. 21 illustrates a SAW device defined by connecting the above-described SAW resonator 324 in series between the longitudinally coupled resonator SAW filter 302 and an input terminal 314. FIG. 22 illustrates a SAW device which includes the SAW resonator 324 connected in series between each of the input terminal 314 and the output terminal 313 and the longitudinally coupled resonator SAW filter 302. In any of the above-described configurations, the advantages of the present invention are obtained.

Figure 23:
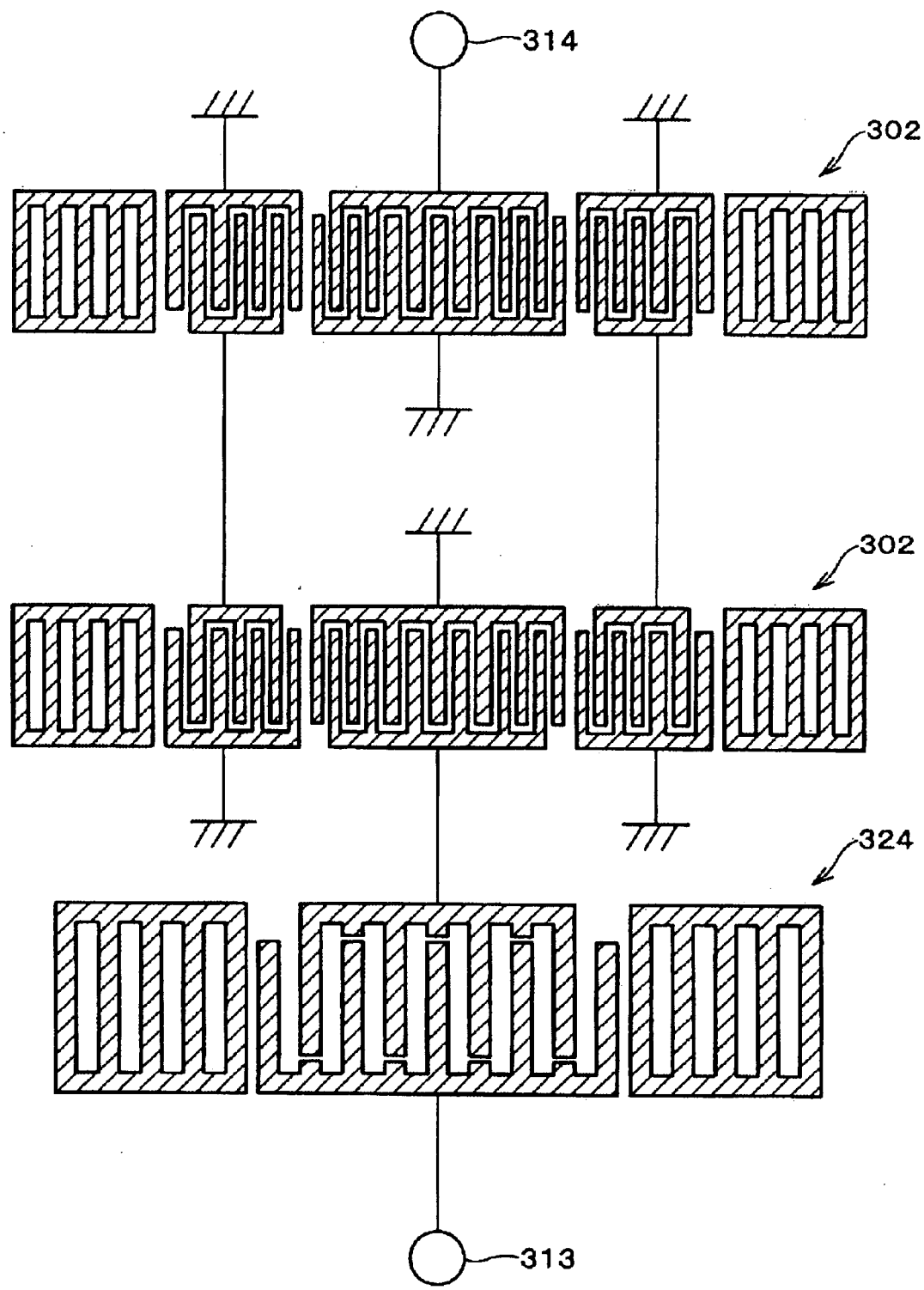
FIG. 23 is a schematic diagram illustrating a SAW device according to a further preferred embodiment of the present invention.
Figure 24:
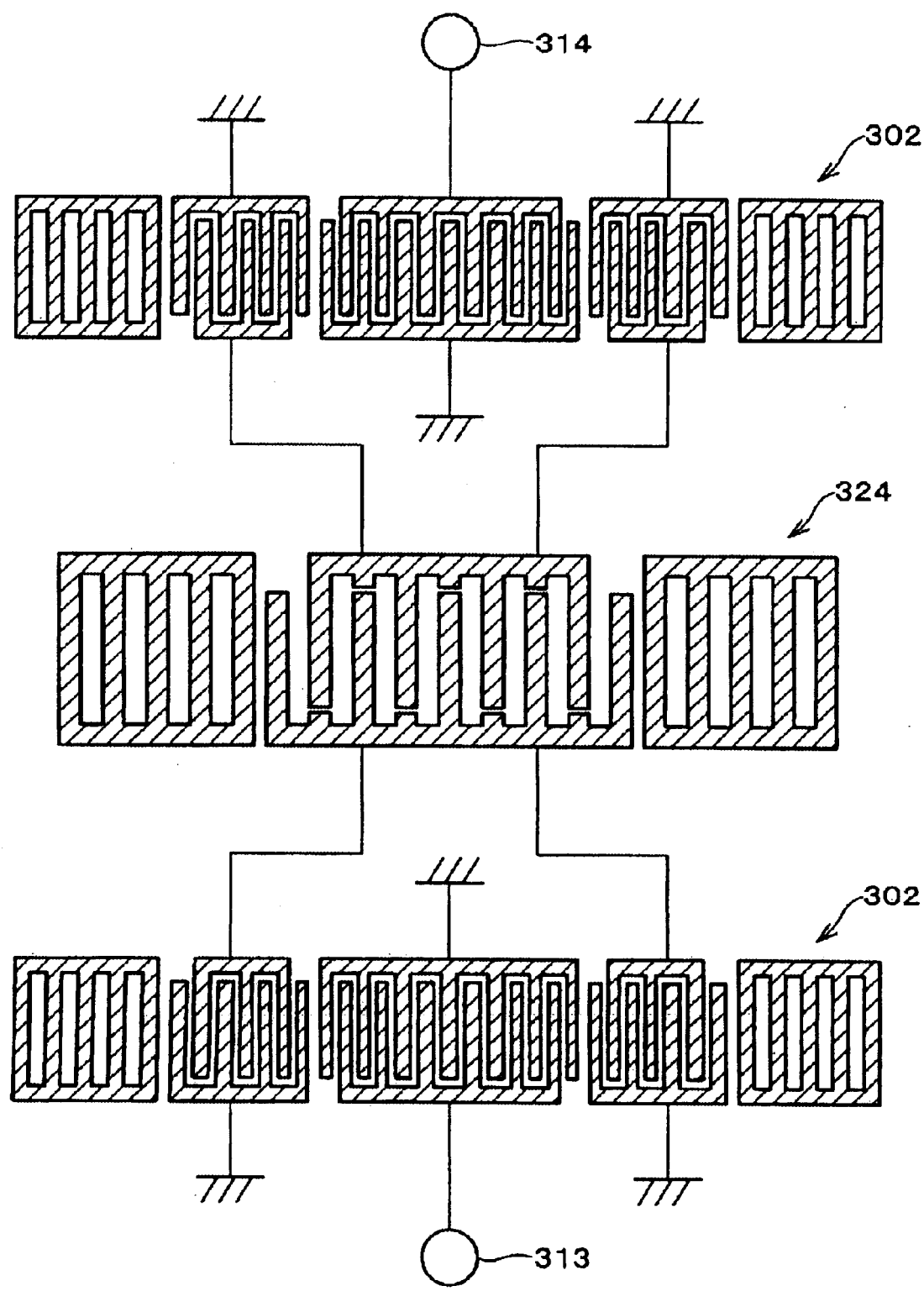
FIG. 24 is a schematic diagram illustrating a SAW device according to yet another preferred embodiment of the present invention.
Figure 25:
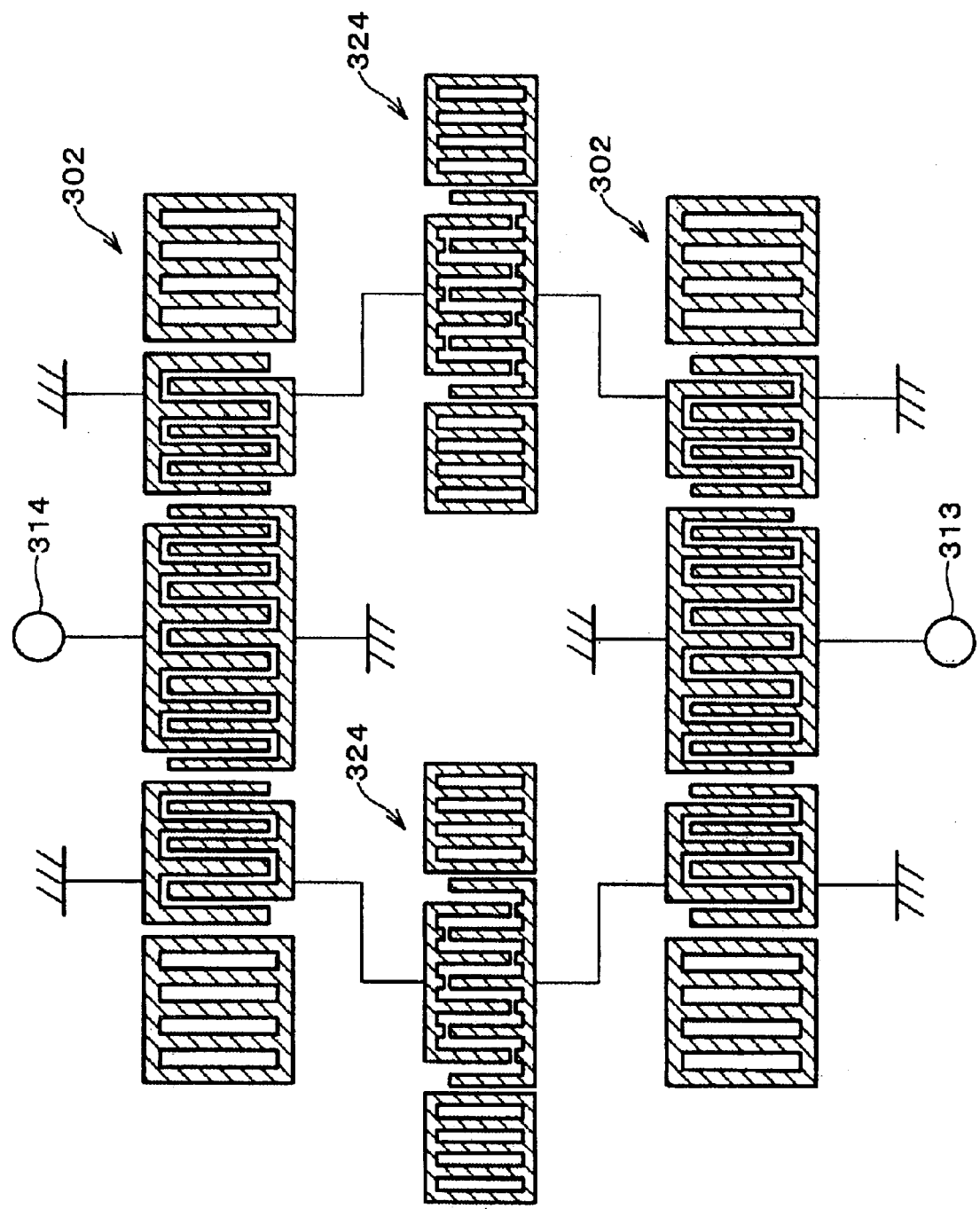
FIG. 25 is a schematic diagram illustrating a SAW device according to a further preferred embodiment of the present invention.

FIGS. 23 through 25 illustrate SAW devices provided with the two cascade-connected longitudinally coupled resonator SAW filters 302. As shown in FIG. 23, the SAW resonator 324 is connected in series between the SAW filter 302 and the output terminal 313. As shown in FIG. 24, the SAW resonator 324 is connected in series between the two SAW filters 302. As shown in FIG. 25, the two SAW resonators 324 are connected in series between the SAW filters 302. Alternatively, the SAW resonator 324 may be connected in series between the SAW filter 302 and the input terminal 314.

Figure 26:
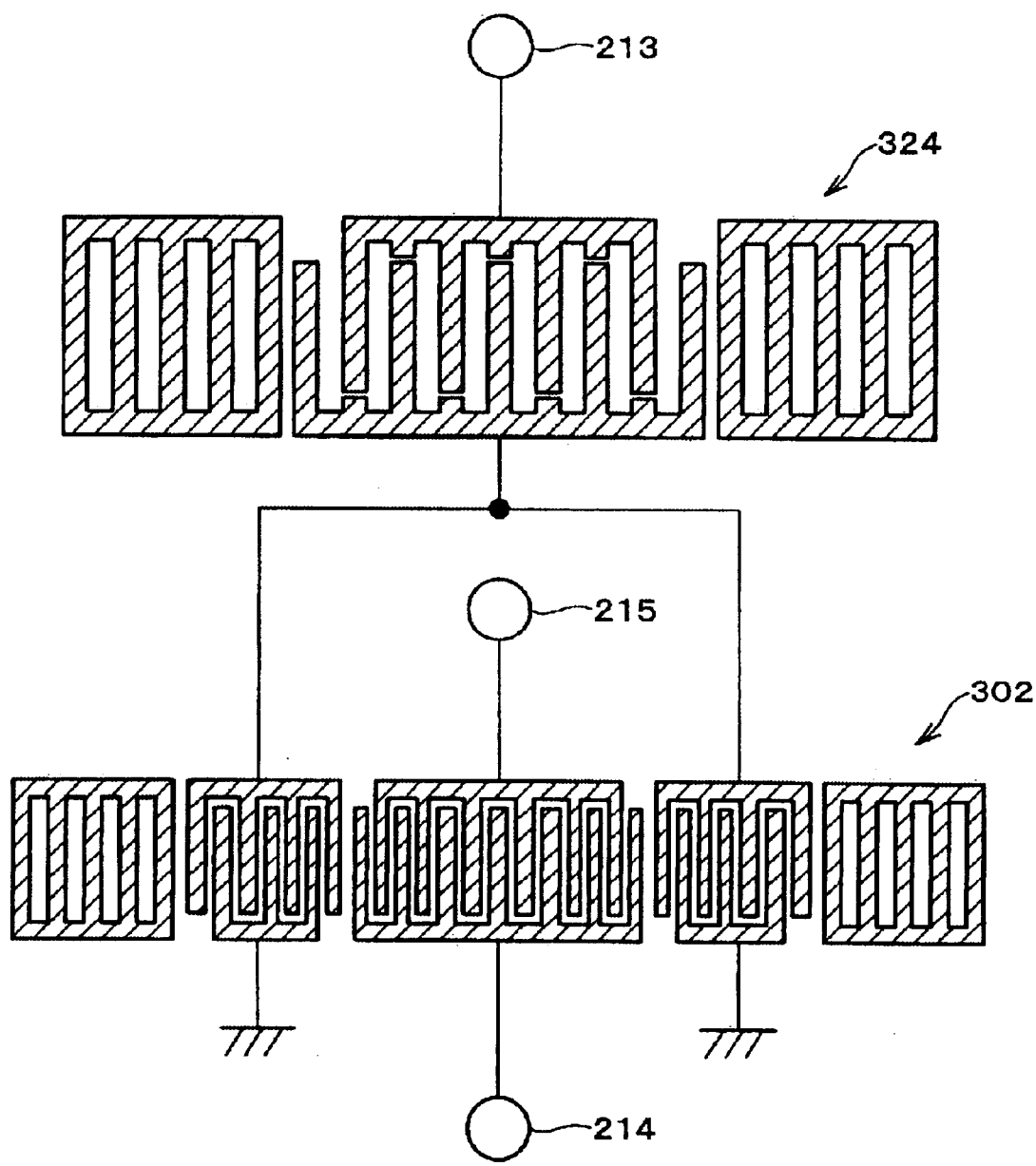
FIG. 26 is a schematic diagram illustrating a SAW device according to another preferred embodiment of the present invention.
Figure 27:
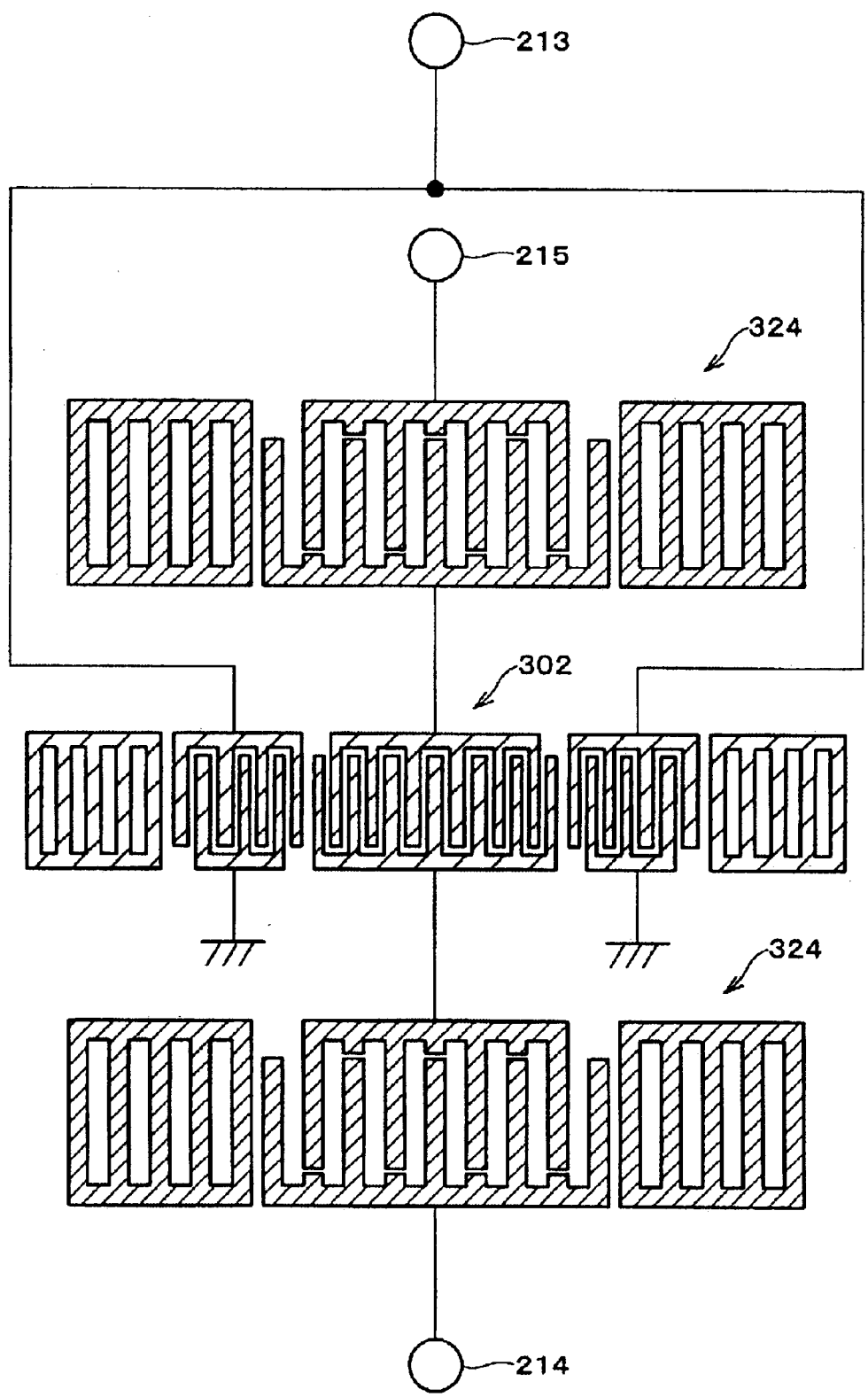
FIG. 27 is a schematic diagram illustrating a SAW device according to still another preferred embodiment of the present invention.

As another modification to the SAW device of the present invention provided with a balanced-to-unbalanced conversion function, as shown in FIG. 26, the balanced signal terminals 214 and 215 are connected to both sides of one IDT of the longitudinally coupled resonator SAW filter 302, and the SAW resonator 324 is connected between the other IDTs and the unbalanced signal terminal 213. Alternatively, as shown in FIG. 27, one SAW resonator 324 is connected between one side of one IDT of the longitudinally coupled resonator SAW filter 302 and the balanced signal terminal 214, and the other SAW resonator 324 is connected between the other side of the IDT and the balanced signal terminal 215. In these cases, the advantages of the present invention are achieved.

Figure 28:
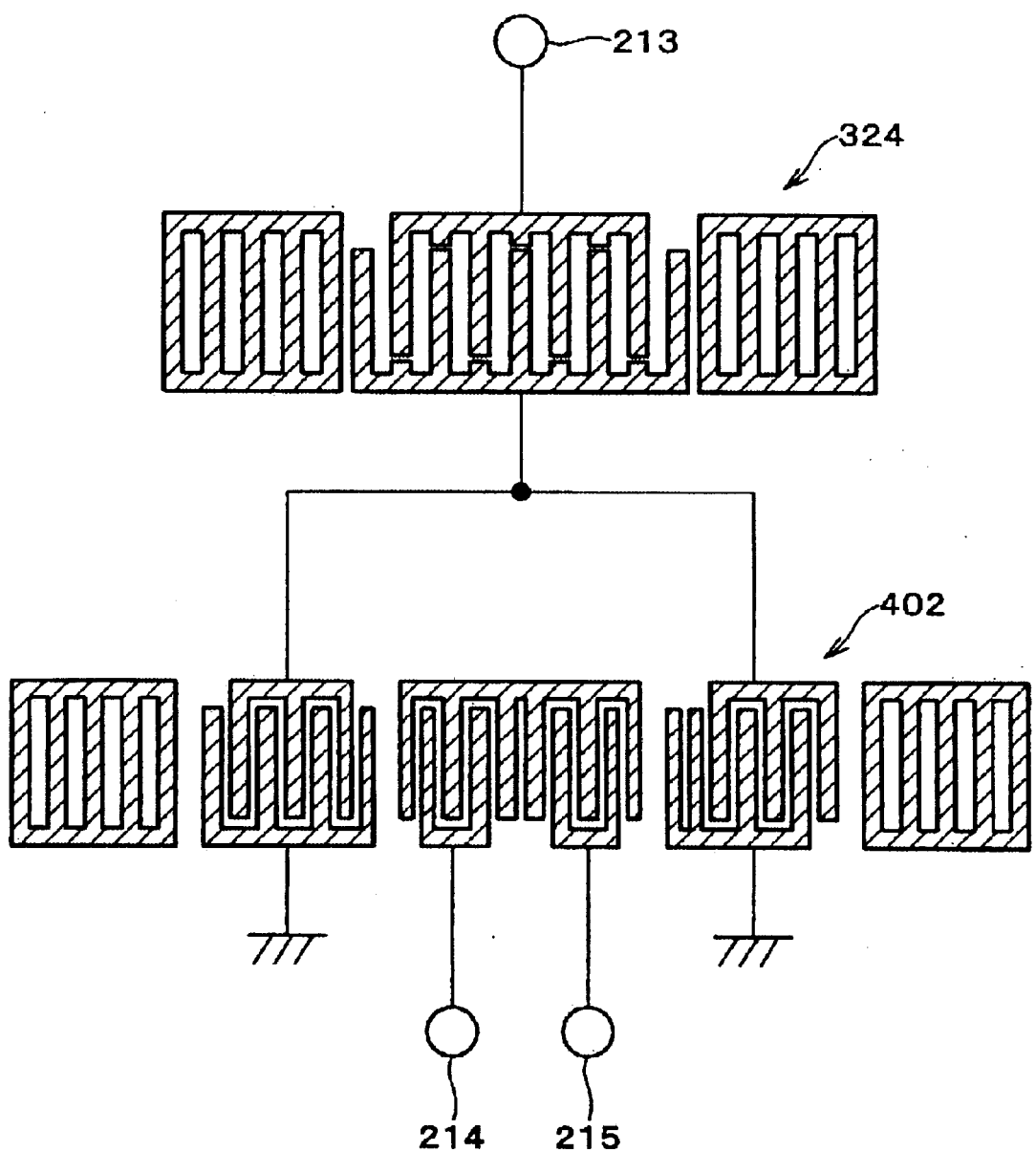
FIG. 28 is a schematic diagram illustrating a SAW device according to still another preferred embodiment of the present invention.
Figure 29:
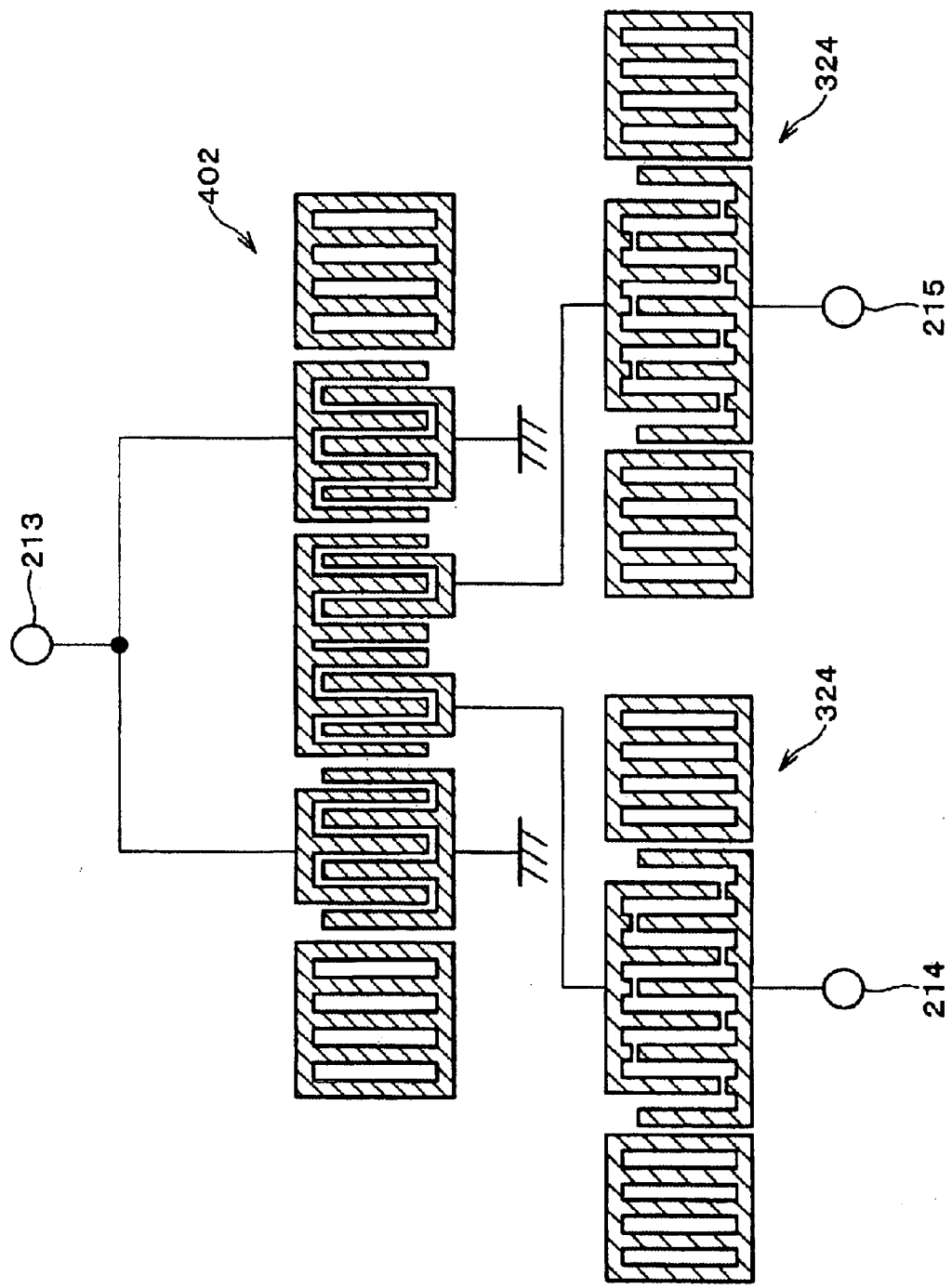
FIG. 29 is a schematic diagram illustrating a SAW device according to still another preferred embodiment of the present invention.

As still another modification to the SAW device of the present invention provided with a balanced-to-unbalanced conversion function, as shown in FIG. 28, one IDT of a longitudinally coupled resonator SAW filter 402 is divided into two portions in a SAW propagating direction. In this SAW device, the balanced signal terminals 214 and 215 is connected to the two divided IDT portions, and the SAW resonator 324 is connected between the other IDTs and the unbalanced signal terminal 213. Alternatively, as shown in FIG. 29, the balanced signal terminals 214 and 215 may be connected to the two divided IDT portions of the SAW filter 402, and one SAW resonator 324 may be connected between one divided IDT portion and the balanced signal terminal 214, and the other SAW resonator 324 may be connected between the other divided IDT portion and the balanced signal terminal 215. In these cases, the advantages of the present invention are obtained.

Figure 30:
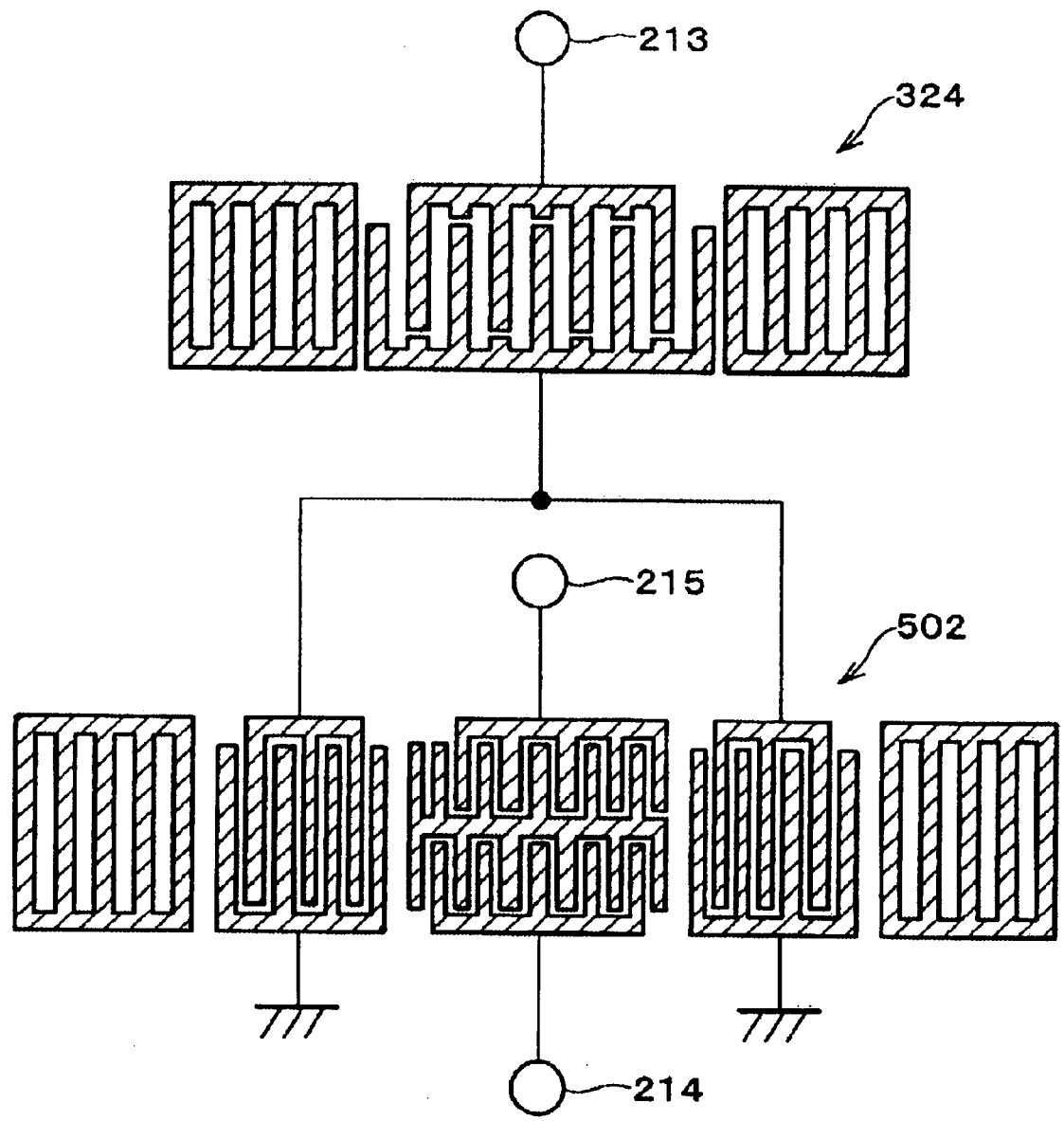
FIG. 30 is a schematic diagram illustrating a SAW device according to still another preferred embodiment of the present invention.
Figure 31:
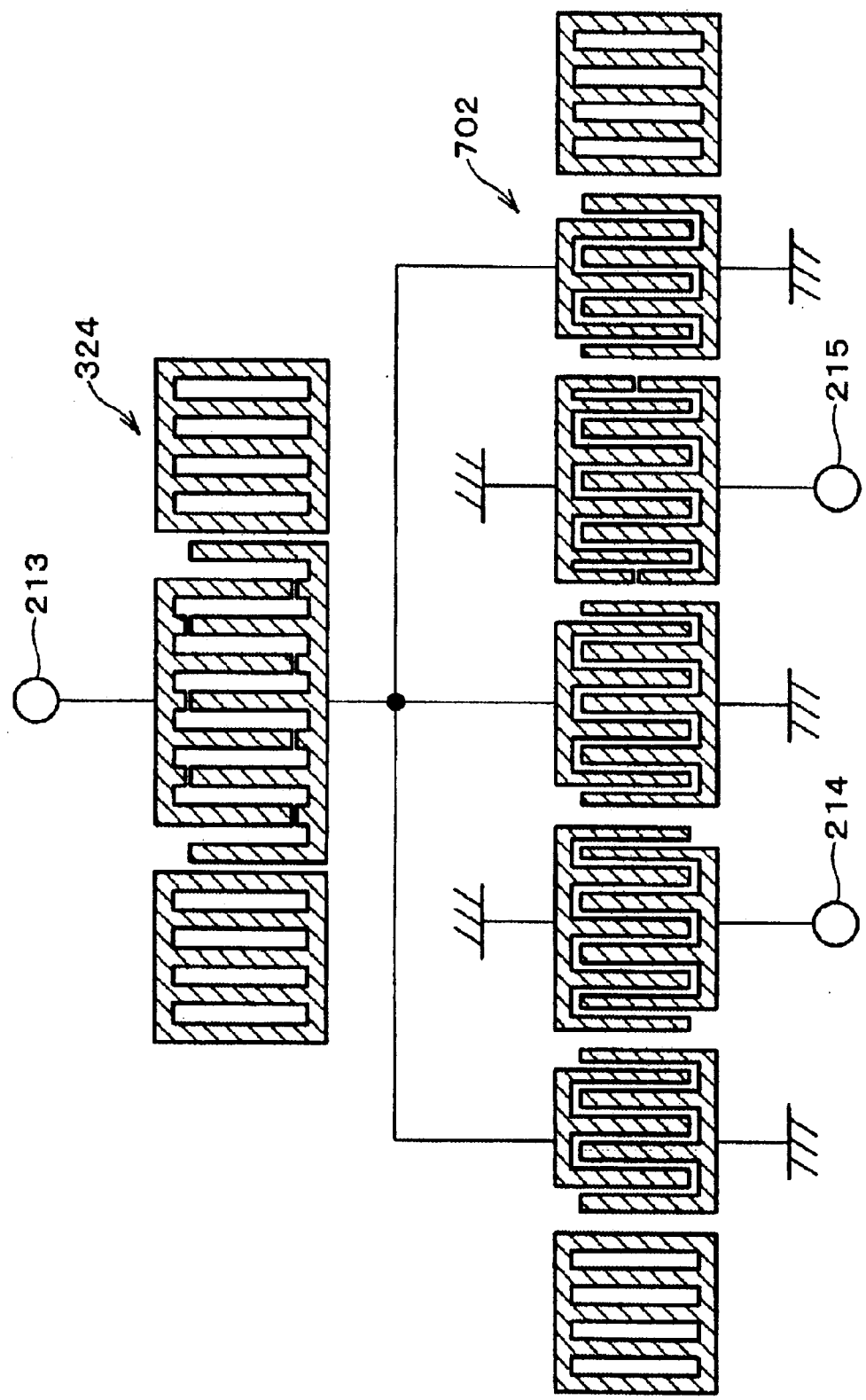
FIG. 31 is a schematic diagram illustrating a SAW device according to still another preferred embodiment of the present invention.

As a further modification to the SAW device of the present invention provided with a balanced-to-unbalanced conversion function, as shown in FIG. 30, one IDT of a longitudinally coupled resonator SAW filter 502 is divided into two portions in the direction of the interdigital length. In this SAW device, the balanced signal terminals 214 and 215 is connected to the two divided IDT portions, and the SAW resonator 324 is connected to the other IDTs and the unbalanced signal terminal 213. Alternatively, as shown in FIG. 31, a SAW filter 702 having five IDTs may be used. In these cases, the advantages of the present invention are achieved.

Figure 32:
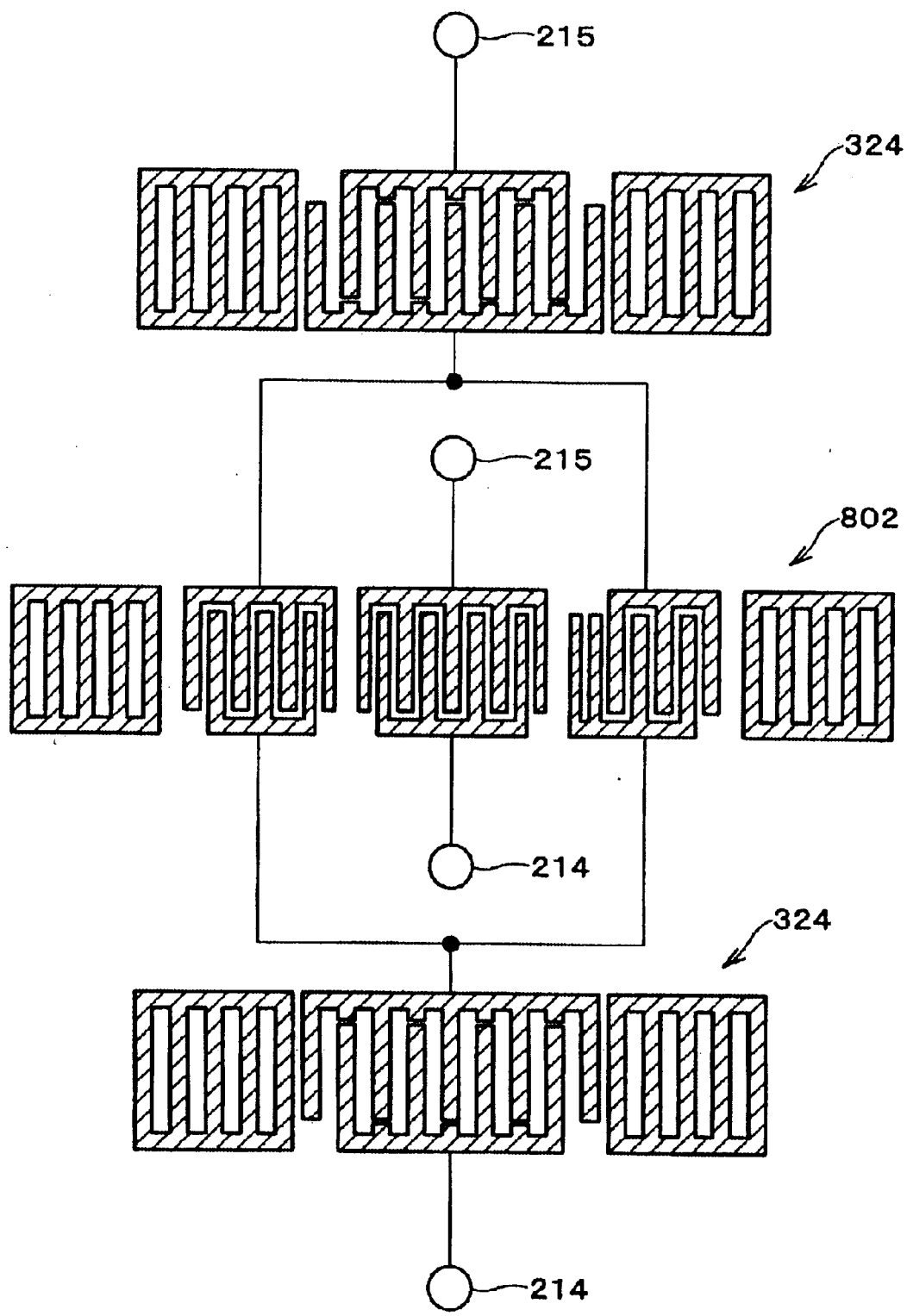
FIG. 32 is a schematic diagram illustrating a SAW device according to still another preferred embodiment of the present invention.
Figure 33:
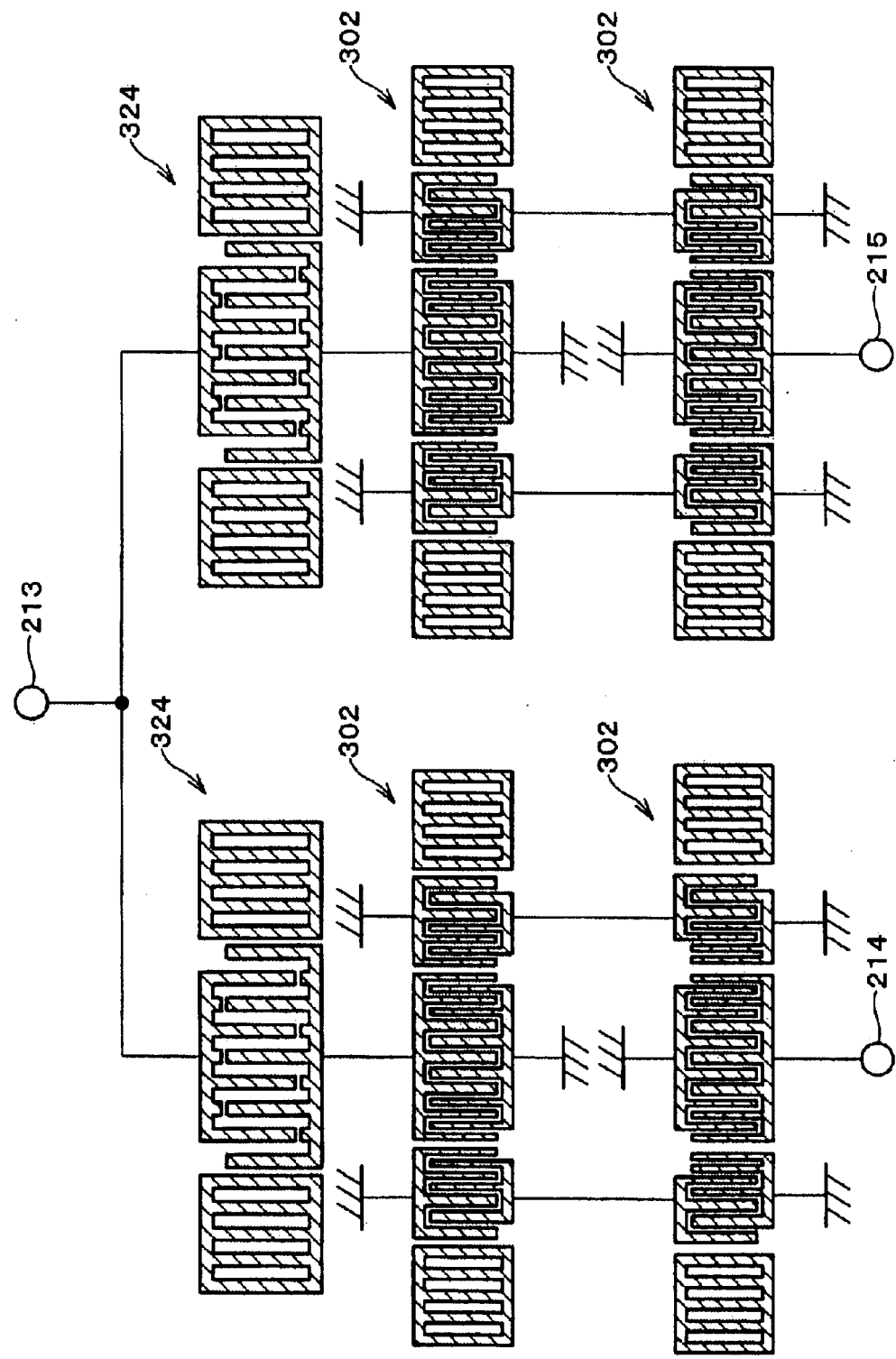
FIG. 33 is a schematic diagram illustrating a SAW device according to still another preferred embodiment of the present invention.
Figure 34:
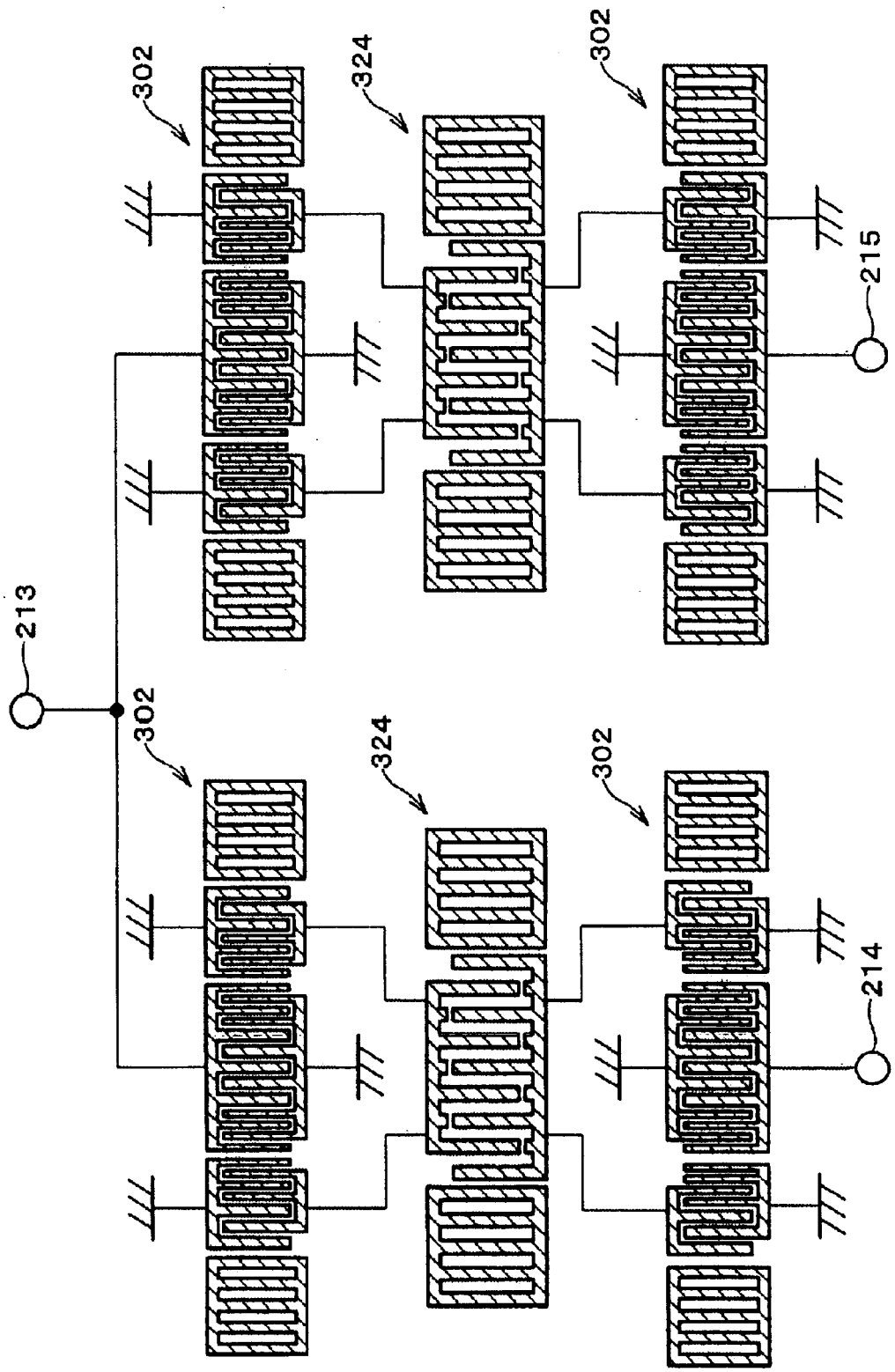
FIG. 34 is a schematic diagram illustrating a SAW device according to still another preferred embodiment of the present invention.
Figure 35:
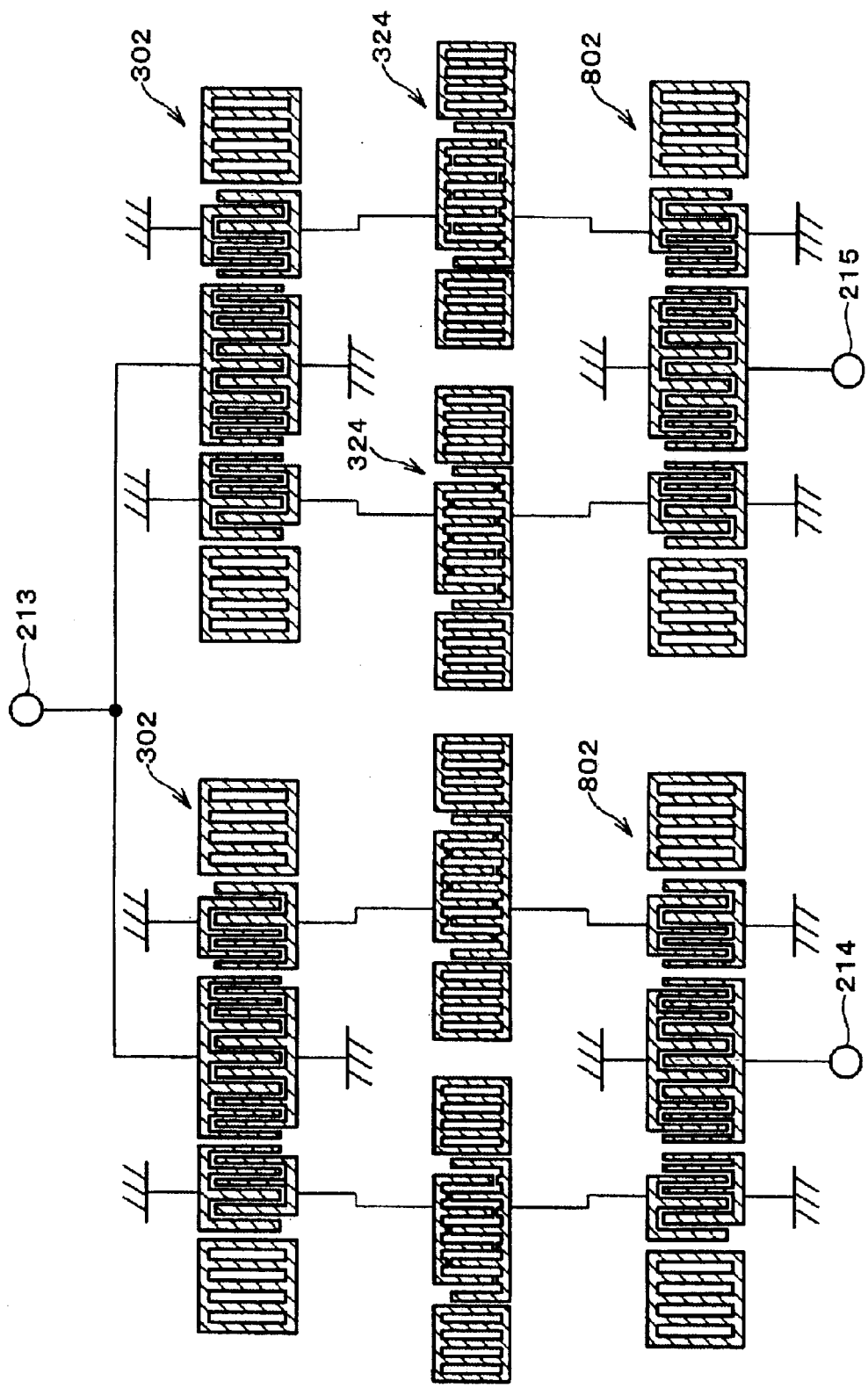
FIG. 35 is a schematic diagram illustrating a SAW device according to still another preferred embodiment of the present invention.
Figure 36:
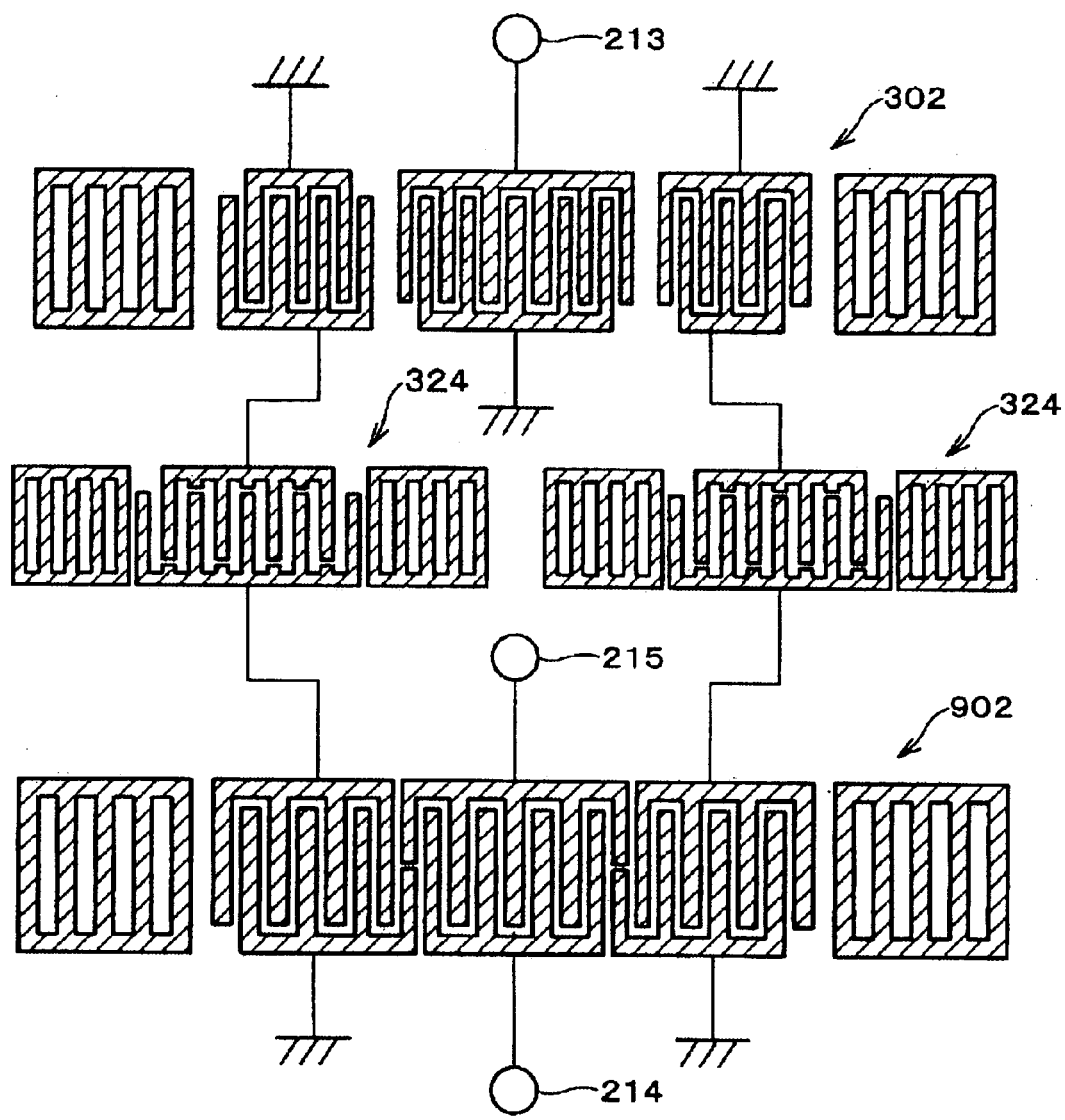
FIG. 36 is a schematic diagram illustrating a SAW device according to still another preferred embodiment of the present invention.

The number of IDTs is not a limitation in the present invention. A SAW filter having any number of IDTs may be used. Also, as shown in FIG. 32, the balanced signal terminals 214 and 215 may each define both the input and output terminals. Advantages of the present invention are also achieved by the configurations of SAW devices having a balanced-to-unbalanced conversion function shown in FIGS. 33 through 36.

The above-described preferred embodiment has been described in the context of a longitudinally coupled resonator SAW filter. However, a transversally coupled resonator SAW filter or a transversal filter may be provided, in which case, advantages similar to those achieved by this preferred embodiment are obtained.

Figure 37:
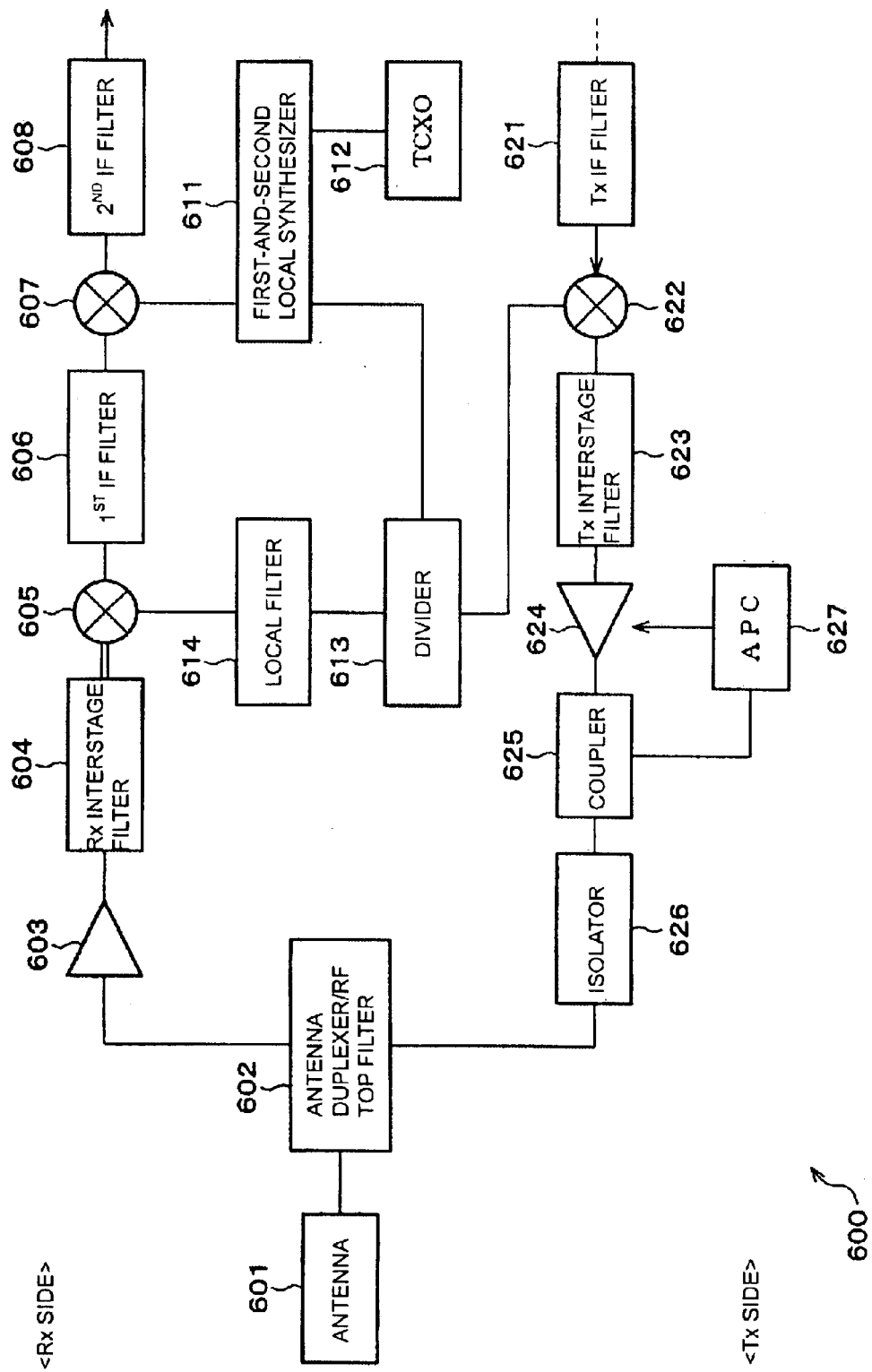
FIG. 37 is a circuit block diagram illustrating a communication apparatus according to another preferred embodiment of the present invention.
Figure 38:
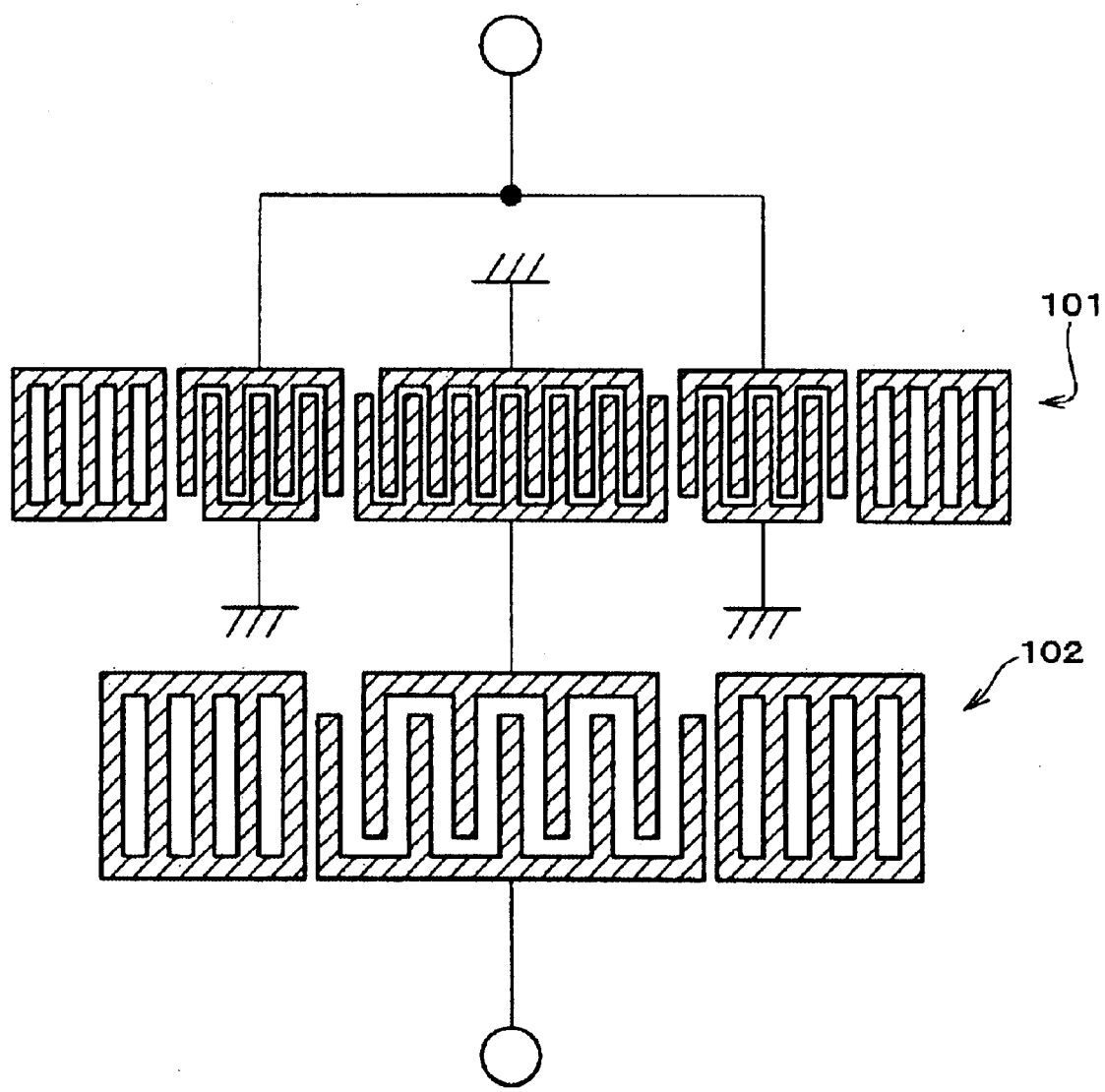
FIG. 38 is a schematic diagram illustrating a known SAW device formed by connecting a SAW resonator in series to a SAW filter.
Figure 39:
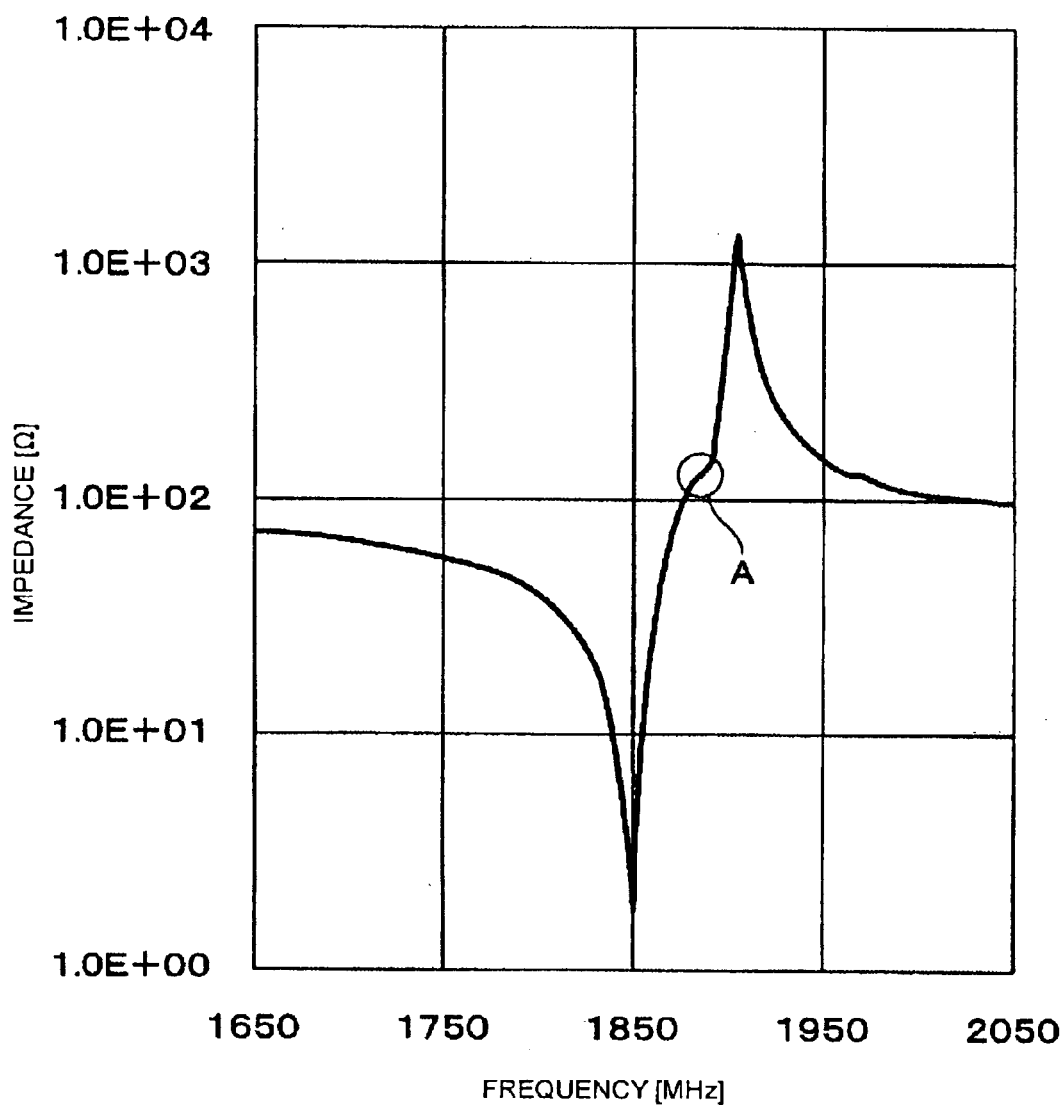
FIG. 39 is a graph illustrating a frequency-vs.-impedance characteristic of SAW resonators used in the known SAW device shown in FIG. 38.
Figure 40:
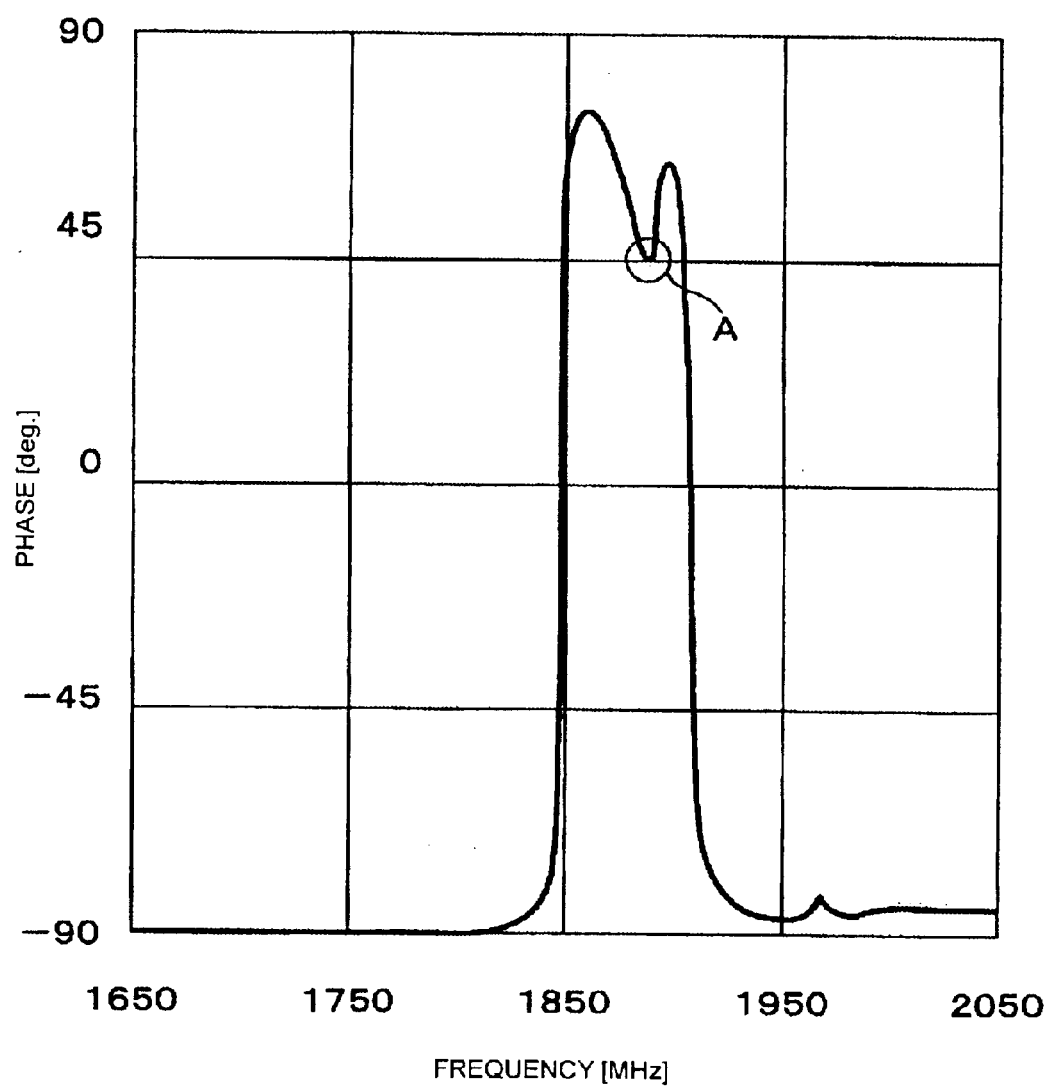
FIG. 40 is a graph illustrating a frequency-vs.-phase characteristic of the SAW resonators.

A communication apparatus 600 including the SAW device of this preferred embodiment is described below with reference to FIG. 37.

The communication apparatus 600 includes, on the receiver (Rx) side, an antenna 601, an antenna duplexer/RF top filter 602, an amplifier 603, an Rx interstage filter 604, a mixer 605, a first IF filter 606, a mixer 607, a second IF filter 608, a first-and-second local synthesizer 611, a temperature compensated crystal oscillator (TCXO) 612, a divider 613, and a local filter 614. It is preferable that balanced signals are transmitted from the Rx interstage filter 604 to the mixer 605, as indicated by the two lines in FIG. 37, in order to ensure a balancing characteristic.

The communication apparatus 600 includes, on the transmitter (Tx) side, the antenna 601, the antenna duplexer/RF top filter 602, a Tx IF filter 621, a mixer 622, a Tx interstage filter 623, an amplifier 624, a coupler 625, an isolator 626, and an automatic power control (APC) 627. The antenna 601 and the antenna duplexer/RF top filter 602 are shared by the Rx side and the Tx side.

The SAW device of the above-described preferred embodiment is preferably used as the Rx interstage filter 604, the first IF filter 606, the Tx IF filter 621, or the Tx interstage filter 623.

The communication apparatus 600 includes small SAW devices that have outstanding transmission characteristics, in particular, the phase characteristic. Accordingly, the communication apparatus 600 also has outstanding transmission characteristics (communication characteristics) while having a reduced size that is required in a higher frequency range, in particular, in a GHz or higher band.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave device comprising:
   a piezoelectric substrate;
   at least one surface acoustic wave filter provided on the piezoelectric substrate and including at least two interdigital transducers arranged along a direction in which a surface acoustic wave propagates; and
   at least one surface acoustic wave resonator provided on the piezoelectric substrate and connected in series to said at least one surface acoustic wave filter; wherein
   said at least one surface acoustic wave resonator is arranged such that a resonant frequency thereof is located within a pass band of said at least one surface acoustic wave filter and such that an antiresonant frequency thereof is located outside the pass band, and a dummy electrode is disposed between an electrode finger and a bus bar of each of said at least one surface acoustic wave resonator such that a spurious response caused by a surface skimming bulk wave is located within the pass band.

2. A surface acoustic wave device according to claim 1, wherein a gap between the dummy electrode and the electrode finger of said at least one surface acoustic wave resonator is about 0.5λ or less, where a wavelength determined by a pitch between the electrode fingers of the at least two interdigital transducers is indicated by λ.

3. A surface acoustic wave device according to claim 1, wherein a length of the dummy electrode of said at least one surface acoustic wave resonator is at least about 0.25λ, where a wavelength determined by a pitch between the electrode fingers of said at least one surface acoustic wave resonator is indicated by λ.

4. A surface acoustic wave device according to claim 1, wherein an interdigital length of the interdigital transducers of said at least one surface acoustic wave resonator is about 45λ or less, where a wavelength determined by a pitch between the electrode fingers of said at least one surface acoustic wave resonator is indicated by λ.

5. A surface acoustic wave device according to claim 1, wherein said surface acoustic wave filter is a longitudinally coupled resonator surface acoustic wave filter.

6. A surface acoustic wave device according to claim 1, wherein a balanced-to-unbalanced conversion function is provided in the surface acoustic wave filter.

7. A communication apparatus comprising the surface acoustic wave device set forth in claim 1.

8. A surface acoustic wave device comprising:
   a piezoelectric substrate;
   at least one surface acoustic wave filter provided on the piezoelectric substrate and including at least two interdigital transducers arranged along a direction in which a surface acoustic wave propagates; and
   at least one surface acoustic wave resonator provided on the piezoelectric substrate and connected in series to said at least one surface acoustic wave filter; wherein
   said at least one surface acoustic wave resonator is arranged such that a resonant frequency thereof is located within a pass band of said at least one surface acoustic wave filter and that an antiresonant frequency thereof is located outside the pass band, and a dummy electrode is disposed between an electrode finger and a bus bar of each of said at least one surface acoustic wave resonator; and a gap between the dummy electrode and the electrode finger of the interdigital transducers of said at least one surface acoustic wave resonator is about $0.5\lambda$ or less, where a wavelength determined by a pitch between the electrode fingers of the interdigital transducers is indicated by $\lambda$.

9. A surface acoustic wave device according to claim 8, wherein said surface acoustic wave filter is a longitudinally coupled resonator surface acoustic wave filter.

10. A surface acoustic wave device according to claim 8, wherein a balanced-to-unbalanced conversion function is provided in the surface acoustic wave filter.

11. A communication apparatus comprising the surface acoustic wave device set forth in claim 8.

12. A surface acoustic wave device comprising:

a piezoelectric substrate;

at least one surface acoustic wave filter provided on the piezoelectric substrate and including at least two interdigital transducers arranged along a direction in which a surface acoustic wave propagates; and at least one surface acoustic wave resonator provided on the piezoelectric substrate and connected in series to said at least one surface acoustic wave filter; wherein said at least one surface acoustic wave resonator is arranged such that a resonant frequency thereof is located within a pass band of said at least one surface acoustic wave filter and that an antiresonant frequency thereof is located outside the pass band, and a dummy electrode is provided between an electrode finger and a bus bar of each of said at least one surface acoustic wave resonator; and a length of the dummy electrode of said at least one surface acoustic wave resonator is at least about $0.25\lambda$, where a wavelength determined by a pitch between the electrode fingers of said at least one surface acoustic wave resonator is indicated by $\lambda$.

13. A surface acoustic wave device according to claim 12, wherein said surface acoustic wave filter is a longitudinally coupled resonator surface acoustic wave filter.

14. A surface acoustic wave device according to claim 12, wherein a balanced-to-unbalanced conversion function is provided in the surface acoustic wave filter.

15. A communication apparatus comprising the surface acoustic wave device set forth in claim 12.

* * * * *